(12) United States Patent
Strong et al.

(10) Patent No.: US 12,205,902 B2
(45) Date of Patent: *Jan. 21, 2025

(54) HIGH-DENSITY INTERCONNECTS FOR INTEGRATED CIRCUIT PACKAGES

(71) Applicant: Intel Corporation, Santa Clara, CA (US)

(72) Inventors: Veronica Strong, Hillsboro, OR (US); Aleksandar Aleksov, Chandler, AZ (US); Henning Braunisch, Phoenix, AZ (US); Brandon Rawlings, Chandler, AZ (US); Johanna Swan, Scottsdale, AZ (US); Shawna Liff, Scottsdale, AZ (US)

(73) Assignee: Intel Corporation, Santa Clara, CA (US)

(*) Notice: Subject to any disclaimer, the term of this patent is extended or adjusted under 35 U.S.C. 154(b) by 308 days.

This patent is subject to a terminal disclaimer.

(21) Appl. No.: 17/388,964

(22) Filed: Jul. 29, 2021

(65) Prior Publication Data

US 2021/0358855 A1 Nov. 18, 2021

Related U.S. Application Data

(63) Continuation of application No. 16/573,948, filed on Sep. 17, 2019, now Pat. No. 11,133,263.

(51) Int. Cl.
*H01L 23/538* (2006.01)
*H01L 21/48* (2006.01)
(Continued)

(52) U.S. Cl.
CPC ...... *H01L 23/5389* (2013.01); *H01L 21/4857* (2013.01); *H01L 21/56* (2013.01);
(Continued)

(58) Field of Classification Search
None
See application file for complete search history.

(56) References Cited

U.S. PATENT DOCUMENTS 9,768,145 B2 9/2017 Yu et al.
11,133,263 B2 * 9/2021 Strong ................ H01L 23/3128
(Continued)

FOREIGN PATENT DOCUMENTS

CN 106486383 3/2017
JP 2007311585 11/2007
(Continued)

OTHER PUBLICATIONS

Office Action from Indian Patent Application No. 202044023272, dated Jan. 11, 2022.
(Continued)

*Primary Examiner* — Robert K Carpenter
(74) *Attorney, Agent, or Firm* — Essential Patents Group, LLP

(57) ABSTRACT

An integrated circuit package may be formed including at least one die side integrated circuit device having an active surface electrically attached to an electronic interposer, wherein the at least one die side integrated circuit device is at least partially encased in a mold material layer and wherein a back surface of the at least one die side integrated circuit device is in substantially the same plane as an outer surface of the mold material layer. At least one stacked integrated circuit device may be electrically attached to the back surface of the at least one die side integrated circuit through an interconnection structure formed between the at least one die side integrated circuit device and the at least one stacked integrated circuit device.

20 Claims, 19 Drawing Sheets

(51) Int. Cl.
    *H01L 21/56*     (2006.01)
    *H01L 23/00*     (2006.01)
    *H01L 25/10*     (2006.01)
    *H05K 1/18*     (2006.01)

(52) U.S. Cl.
    CPC ...... *H01L 23/5383* (2013.01); *H01L 23/5386* (2013.01); *H01L 24/24* (2013.01); *H01L 24/73* (2013.01); *H01L 24/82* (2013.01); *H01L 25/105* (2013.01); *H05K 1/181* (2013.01); *H01L 2224/24146* (2013.01); *H01L 2224/73259* (2013.01); *H05K 2201/10378* (2013.01); *H05K 2201/10734* (2013.01)

(56) References Cited

U.S. PATENT DOCUMENTS

| | | |
|---|---|---|
| 2011/0215464 A1 | 9/2011 | Guzek et al. |
| 2012/0106117 A1 | 5/2012 | Sundaram et al. |
| 2013/0147026 A1 | 6/2013 | Topacio et al. |
| 2014/0103488 A1 | 4/2014 | Chen et al. |
| 2014/0124949 A1 | 5/2014 | Paek et al. |
| 2015/0069595 A1 | 3/2015 | Chen et al. |
| 2015/0235991 A1 | 8/2015 | Gu et al. |
| 2015/0317276 A1 | 11/2015 | Ken et al. |
| 2016/0260684 A1 | 9/2016 | Zhai et al. |
| 2017/0011993 A1 | 1/2017 | Zhao et al. |
| 2017/0062383 A1 | 3/2017 | Yee et al. |
| 2018/0358328 A1 | 12/2018 | Kang et al. |
| 2019/0164912 A1 | 5/2019 | Lee et al. |
| 2020/0006186 A1 | 1/2020 | Pan et al. |

FOREIGN PATENT DOCUMENTS

| | | |
|---|---|---|
| JP | 2017505999 A | 2/2017 |
| JP | 2018032850 | 3/2018 |
| WO | 2009084301 | 5/2011 |

OTHER PUBLICATIONS

Notice of Allowance for U.S. Appl. No. 16/573,946, dated May 25, 2022.
Restriction Requirement for U.S. Appl. No. 16/573,946, dated Mar. 3, 2022.
Search Report for Malaysian Patent Application No. PI2020003479, dated Mar. 22, 2023.
Non-Final Office Action for U.S. Appl. No. 16/573,943, notified Sep. 23, 2020.
Notice of Allowance for U.S. Appl. No. 16/573,943, dated Jan. 13, 2021.
Office Action for U.S. Appl. No. 16/573,948, dated Mar. 4, 2021.
Office Action from Japanese Patent Application No. 2020-105922 notified May 31, 2024, 30 pgs.
Office Action from Taiwanese Patent Application No. 109120603 notified Jun. 14, 2024, 12 pgs.
Notice of Allowance from Japanese Patent Application No. 2020-105922 notified Sep. 11, 2024, 6 pgs.
Notice of Allowance from Malaysian Patent Application No. PI2020003479 notified Jun. 21, 2024, 1 pg.

* cited by examiner

HIGH-DENSITY INTERCONNECTS FOR INTEGRATED CIRCUIT PACKAGES

CLAIM FOR PRIORITY

This application is a continuation of and claims priority to U.S. patent application Ser. No. 16/573,948, filed Sep. 17, 2019, and entitled "HIGH-DENSITY INTERCONNECTS FOR INTEGRATED CIRCUIT PACKAGES", and which is incorporated by reference in its entirety.

TECHNICAL FIELD

Embodiments of the present description generally relate to the field of integrated circuit package fabrication, and, more specifically, to the fabrication of high-density interconnects within integrated circuit packages.

BACKGROUND

The integrated circuit industry is continually striving to produce ever faster, smaller, and thinner integrated circuit packages for use in various electronic products, including, but not limited to, computer servers and portable products, such as portable computers, electronic tablets, cellular phones, digital cameras, and the like.

As a part of this effort, integrated circuit packages containing multiple integrated circuit devices, such as microelectronic dice, have been developed. These multiple integrated circuit device packages are referred to in the art as multi-device or multi-chip packages (MCPs) and offer the potential for increased architectural flexibility at reduced cost, but must do so such that appropriate interconnects between integrated circuit devices and to external components are provided. As will be understood to those skilled in the art, interconnect density is an important consideration because an insufficient, number of integrated circuit device connections would limit the bandwidth capability for the affected integrated circuit device interface, and thus would reduce the communication efficiency and capability between integrated circuit devices.

These interconnects are provided through the fabrication of interconnection structures comprising conductive routes formed on and through dielectric layers. The interconnection structures may be formed on substrates or as at least a portion of an interposer, wherein the integrated circuit devices are mechanically attached and electrically connected to the interconnection structures.

BRIEF DESCRIPTION OF THE DRAWINGS

The subject matter of the present disclosure is particularly pointed out and distinctly claimed in the concluding portion of the specification. The foregoing and other features of the present disclosure will become more fully apparent from the following description and appended claims, taken in conjunction with the accompanying drawings. It is understood that the accompanying drawings depict only several embodiments in accordance with the present disclosure and are, therefore, not to be considered limiting of its scope. The disclosure will be described with additional specificity and detail through use of the accompanying drawings, such that the advantages of the present disclosure can be more readily ascertained, in which:

DETAILED DESCRIPTION

Figure 1:
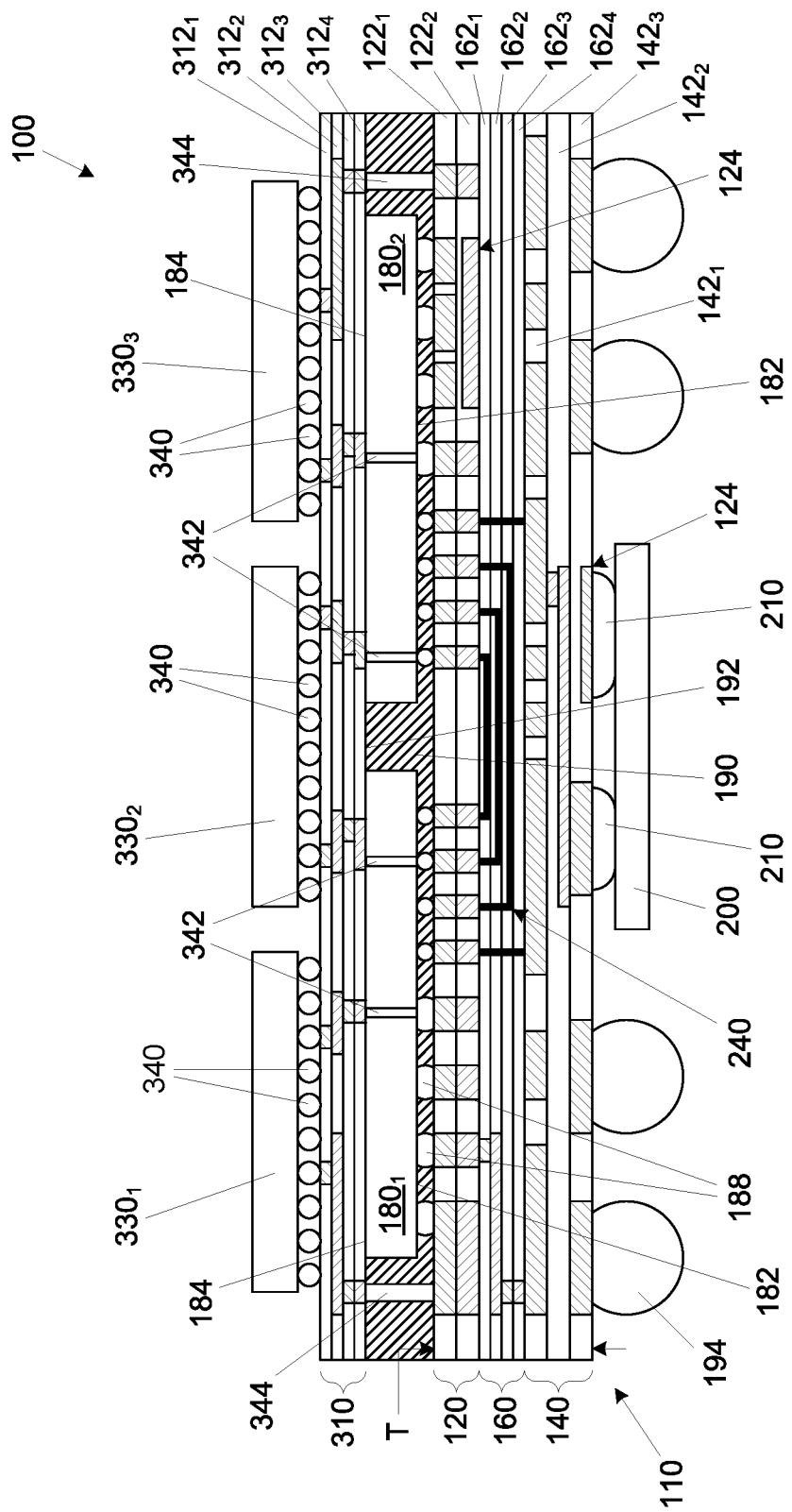
FIG. 1 is a side cross-sectional view of an integrated circuit package, according to one embodiment of the present description.

In the following detailed description, reference is made to the accompanying drawings that show, by way of illustration, specific embodiments in which the claimed subject matter may be practiced. These embodiments are described in sufficient detail to enable those skilled in the art to practice the subject matter. It is to be understood that the various embodiments, although different, are not necessarily mutually exclusive. For example, a particular feature, structure, or characteristic described herein, in connection with one embodiment, may be implemented within other embodiments without departing from the spirit and scope of the claimed subject matter. References within this specification to "one embodiment" or "an embodiment" mean that a particular feature, structure, or characteristic described in connection with the embodiment is included in at least one implementation encompassed within the present description. Therefore, the use of the phrase "one embodiment" or "in an embodiment" does not necessarily refer to the same embodiment. In addition, it is to be understood that the location or arrangement of individual elements within each disclosed embodiment may be modified without departing from the spirit and scope of the claimed subject matter. The following detailed description is, therefore, not to be taken in a limiting sense, and the scope of the subject matter is defined only by the appended claims, appropriately interpreted, along with the full range of equivalents to which the appended claims are entitled. In the drawings, like numerals refer to the same or similar elements or functionality throughout the several views, and that elements depicted therein are not necessarily to scale with one another, rather individual elements may be enlarged or reduced in order to more easily comprehend the elements in the context of the present description.

The terms "over", "to", "between" and "on" as used herein may refer to a relative position of one layer with respect to other layers. One layer "over" or "on" another layer or bonded "to" another layer may be directly in contact with the other layer or may have one or more intervening layers. One layer "between" layers may be directly in contact with the layers or may have one or more intervening layers.

The term "package" generally refers to a self-contained carrier of one or more dice, where the dice are attached to the package substrate, and may be encapsulated for protection, with integrated or wire-bonded interconnects between the dice and leads, pins or bumps located on the external portions of the package substrate. The package may contain a single die, or multiple dice, providing a specific function. The package is usually mounted on a printed circuit board for interconnection with other packaged integrated circuits and discrete components, forming a larger circuit.

Here, the term "cored" generally refers to a substrate of an integrated circuit package built upon a board, card or wafer comprising a non-flexible stiff material. Typically, a small printed circuit board is used as a core, upon which integrated circuit device and discrete passive components may be soldered. Typically, the core has vias extending from one side to the other, allowing circuitry on one side of the core to be coupled directly to circuitry on the opposite side of the core. The core may also serve as a platform for building up layers of conductors and dielectric materials.

Here, the term "coreless" generally refers to a substrate of an integrated circuit package having no core. The lack of a core allows for higher-density package architectures, as the through-vias have relatively large dimensions and pitch compared to high-density interconnects.

Here, the term "land side", if used herein, generally refers to the side of the substrate of the integrated circuit package closest to the plane of attachment to a printed circuit board, motherboard, or other package. This is in contrast to the term "die side", which is the side of the substrate of the integrated circuit package to which the die or dice are attached.

Here, the term "dielectric" generally refers to any number of non-electrically conductive materials that make up the structure of a package substrate. For purposes of this disclosure, dielectric material may be incorporated into an integrated circuit package as layers of laminate film or as a resin molded over integrated circuit dice mounted on the substrate.

Here, the term "metallization" generally refers to metal layers formed over and through the dielectric material of the package substrate. The metal layers are generally patterned to form metal structures such as traces and bond pads. The metallization of a package substrate may be confined to a single layer or in multiple layers separated by layers of dielectric.

Here, the term "bond pad" generally refers to metallization structures that terminate integrated traces and vias in integrated circuit packages and dies. The term "solder pad" may be occasionally substituted for "bond pad" and carries the same meaning.

Here, the term "solder bump" generally refers to a solder layer formed on a bond pad. The solder layer typically has a round shape, hence the term "solder bump".

Here, the term "substrate" generally refers to a planar platform comprising dielectric and metallization structures. The substrate mechanically supports and electrically couples one or more IC dies on a single platform, with encapsulation of the one or more IC dies by a moldable dielectric material. The substrate generally comprises solder bumps as bonding interconnects on both sides. One side of the substrate, generally referred to as the "die side", comprises solder bumps for chip or die bonding. The opposite side of the substrate, generally referred to as the "land side", comprises solder bumps for bonding the package to a printed circuit board.

Here, the term "assembly" generally refers to a grouping of parts into a single functional unit. The parts may be separate and are mechanically assembled into a functional unit, where the parts may be removable. In another instance, the parts may be permanently bonded together. In some instances, the parts are integrated together.

Throughout the specification, and in the claims, the term "connected" means a direct connection, such as electrical, mechanical, or magnetic connection between the things that are connected, without any intermediary devices.

The term "coupled" means a direct or indirect connection, such as a direct electrical, mechanical, magnetic or fluidic connection between the things that are connected or an indirect connection, through one or more passive or active intermediary devices.

The term "circuit" or "module" may refer to one or more passive and/or active components that are arranged to cooperate with one another to provide a desired function. The term "signal" may refer to at least one current signal, voltage signal, magnetic signal, or data/clock signal. The meaning of "a," "an," and "the" include plural references. The meaning of "in" includes "in" and "on."

The vertical orientation is in the z-direction and it is understood that recitations of "top", "bottom", "above" and "below" refer to relative positions in the z-dimension with the usual meaning. However, it is understood that embodiments are not necessarily limited to the orientations or configurations illustrated in the figure.

The terms "substantially," "close," "approximately," "near," and "about," generally refer to being within +/−10% of a target value (unless specifically specified). Unless otherwise specified the use of the ordinal adjectives "first," "second," and "third," etc., to describe a common object, merely indicate that different instances of like objects to which are being referred and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

Views labeled "cross-sectional", "profile" and "plan" correspond to orthogonal planes within a cartesian coordinate system. Thus, cross-sectional and profile views are taken in the x-z plane, and plan views are taken in the x-y plane. Typically, profile views in the x-z plane are cross-sectional views. Where appropriate, drawings are labeled with axes to indicate the orientation of the figure.

Embodiments of the present description include an integrated circuit package comprising at least one die side integrated circuit device having an active surface electrically attached to an electronic interposer, wherein the at least one die side integrated circuit device is at least partially encased in a mold material layer and wherein a back surface of the at least one die side integrated circuit device is in substantially the same plane as an outer surface of the mold material layer. At least one stacked integrated circuit device may be electrically attached to the back surface of the at least one die side integrated circuit through an interconnection structure formed between the at least one die side integrated circuit device and the at least one stacked integrated circuit device.

In further embodiments, the electronic interposer may comprise an upper section, a lower section and a middle section, wherein the at least one die side integrated circuit device is electrically attached to the upper section of the electronic interposer. The upper section and the lower section may each have between two and four layers, wherein each layer comprises an organic material layer and at least one conductive route comprising at least one conductive trace and at least one conductive via. The middle section may be formed between the upper section and the lower section, wherein the middle section comprises up to eight layers, wherein each layer comprises an organic material and at least one conductive route comprising at least one conductive trace and at least one conductive via. A thickness of each layer of the middle section is thinner than a thickness of any of the layers of the upper section and thinner than a thickness of any of the layers of the lower section.

FIG. 1 illustrates an integrated circuit package 100 of the present description, which includes an electronic interposer 110 and at least one die side integrated circuit device (illustrated as a first die side integrated circuit device 180$_1$ and a second die side integrated circuit device 180$_2$) electrically attached to the electronic interposer 110. The first die side integrated circuit device 180$_1$ and the second die side integrated circuit device 180$_2$ (as well as any further integrated circuit devices that may be utilized) may be any appropriate device, including, but not limited to, a microprocessor, a chipset, a graphics device, a wireless device, a memory device, an application specific integrated circuit device, a field-programmable gate array device, a chiplet, combinations thereof, stacks thereof, and the like.

As further shown in FIG. 1, the first die side integrated circuit device 180$_1$ and the second die side integrated circuit device 180$_2$ may be attached to the electronic interposer 110 through a plurality of die side device-to-interposer interconnects 188, such as reflowable solder bumps or balls, in a configuration generally known as a flip-chip or controlled collapse chip connection ("C4") configuration. The die side device-to-interposer interconnects 188 may extend between bond pads (not shown) of the first die side integrated circuit device 180$_1$ and the second die side integrated circuit device 180$_2$ and corresponding bond pads (not shown) on the upper section 120 of the electronic interposer 110 to form electrical connections therebetween. It is understood that the die side device-to-interposer interconnects 188 may be in electrical communication with integrated circuitry (not shown) within the first die side integrated circuit device 180$_1$, and may be in electrical communication with integrated circuitry (not shown) within the second die side integrated circuit device 180$_2$.

The die side device-to-interposer interconnects 188 may be any appropriate electrically conductive material or structure, including but not limited to, solder balls, metal bumps or pillars, metal filled epoxies, or a combination thereof. In one embodiment, the die side device-to-interposer interconnects 188 may be solder balls formed from tin, lead/tin alloys (for example, 63% tin/37% lead solder), and high tin content alloys (e.g. 90% or more tin-such as tin/bismuth, eutectic tin/silver, ternary tin/silver/copper, eutectic tin/copper, and similar alloys). In another embodiment, the die side device-to-interposer interconnects 188 may be copper bumps or pillars. In a further embodiment, the die side device-to-interposer interconnects 188 may be metal bumps or pillars coated with a solder material.

In one embodiment, a mold material layer 190, such as an epoxy material, may be used to at least partially encase the first die side integrated circuit device 180$_1$ and the second die side integrated circuit device 180$_2$. In an embodiment, the mold material layer 190 may have an outer surface 192 that is substantially on the same plane with a back surface 184 of the first die side integrated circuit device 180$_1$ and a back surface 184 of the second die side integrated circuit device 180$_2$. The processing and techniques for encasing integrated circuit device in a mold material layer are well known in the art and for purposes of clarity and conciseness are not discussed herein.

As shown in FIG. 1, a stacked high-density interconnection structure 310 may be formed to abut the outer surface 192 of the mold material layer 190, the back surface 184 of the first die side integrated circuit device 180$_1$, and the back surface 184 of the second die side integrated circuit device 180$_2$. In one embodiment, the stacked high-density interconnection structure 310 may be in electrical contact with at least one through-silicon via 342 extending from the back surface 184 of the first die side integrated circuit device 180$_1$ and/or the back surface 184 of the second die side integrated circuit device 180$_2$ to integrated circuitry (not shown) proximate the active surface 182 of the first die side integrated circuit device 180$_1$, and proximate the active surface 182 of the second die side integrated circuit device 180$_2$. In another embodiment, the stacked high-density interconnection structure 310 may be in electrical contact with at least one through-mold via 344 extending through the mold material layer 190 to form an electrical communication between the stacked high-density interconnection structure 310 and the electronic interposer 110.

Figure 2:
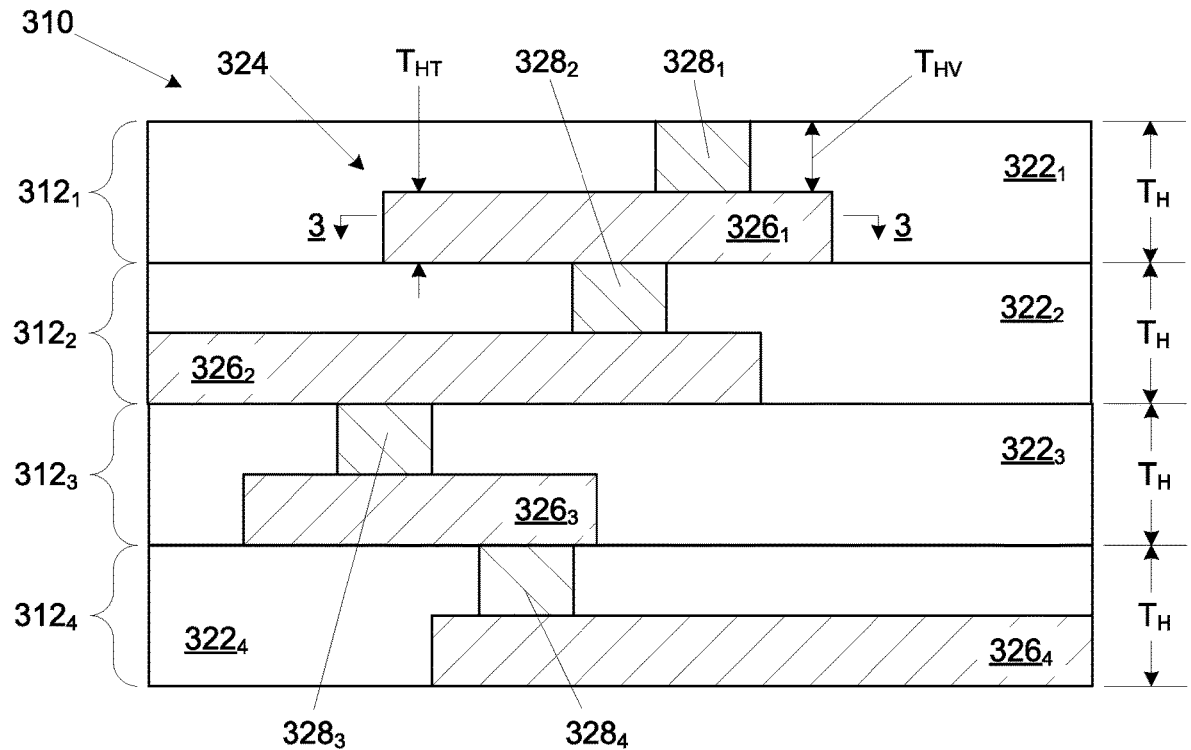
FIG. 2 is a side cross-sectional view of a stacked high-density interconnection structure of the integrated circuit package of FIG. 1, according to an embodiment of the present description.
Figure 3:
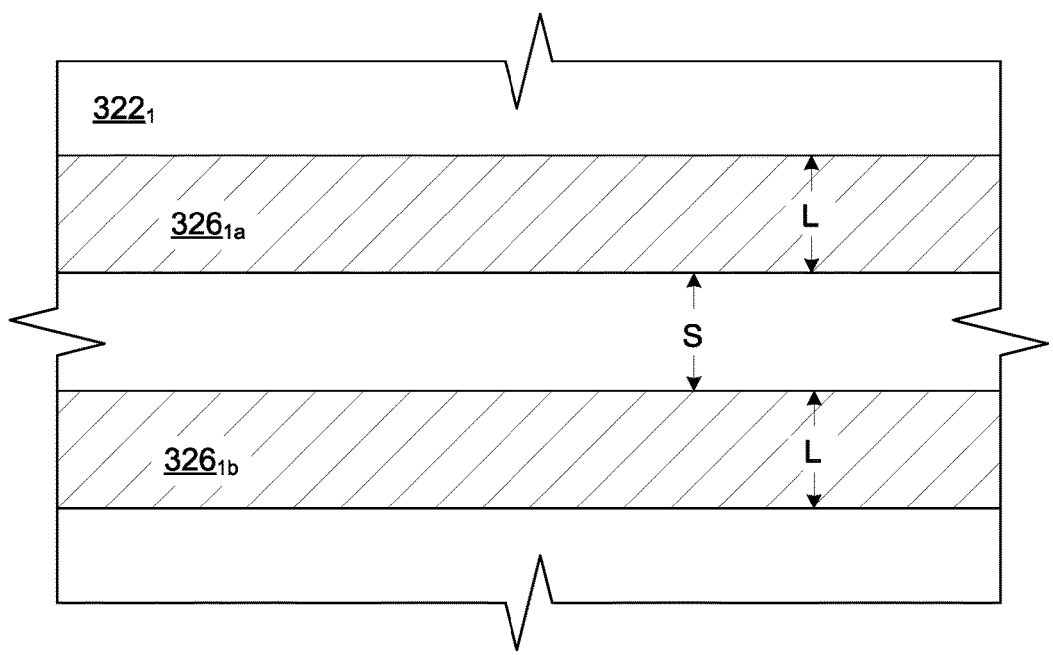
FIG. 3 is a side cross-sectional view along line 3-3 of FIG. 2, according to one embodiment of the present description.

In one embodiment, the stacked high-density interconnection structure 310 may include a plurality of layers, illustrated as four layers, i.e. layers 312$_1$ through 312$_4$. In an embodiment shown in FIG. 2, each of the layers (e.g. layers 312$_1$-312$_4$) of the stacked high-density interconnection structure 310 may have a thickness Tx of between about 1.5 and 9 microns. In another embodiment, each of the layers 312$_1$-312$_4$ may comprise an organic dielectric material layer 322$_1$-322$_4$ and at least one conductive route 324, comprising at least one conductive trace 326$_1$-326$_4$ and at least one conductive via 328$_1$-328$_4$. In one embodiment, the at least one conductive trace 326$_1$-326$_4$ may have a thickness $T_{HT}$ of between about 0.5 and 4 microns, and at least one conductive via $328_1$-$328_4$ may have a thickness $T_{HV}$ of between about 1 and 5 microns. In a further embodiment, shown in FIG. 3, the conductive traces (shown as conductive traces $326_{1a}$ and $326_{1b}$) in one of the organic dielectric material layers (shown as first organic dielectric material layer $322_1$) may have a line width L of between about 0.75 microns and 3 microns, and a line spacing S of between about 0.75 microns and 3 microns. As will be understood to those skilled in the art, the stacked high-density interconnection structure 310 may be used primarily as a routing layer. It is further understood that at least one of the layers $312_1$-$312_4$ of the stacked high-density interconnection structure 310 may be used for ground shielding between any of the layers $312_1$-$312_4$ of the stacked high-density interconnection structure 310. The at least one conductive trace $326_1$-$326_4$ and the at least one conductive via $328_1$-$328_4$ may be made of any appropriate conductive material, including but not limited to, metals, such as copper, silver, nickel, gold, and aluminum, alloys thereof, and the like. The conductive vias $328_1$-$328_4$ can be formed by any appropriate process known in the art, including, but not limited to, lithographically defined vias, zero-misalignment vias, self-aligned vias, or the like.

In one embodiment, at least one stacked integrated circuit device (shown as a first stacked integrated circuit device $330_1$, a second stacked integrated circuit device $330_2$, and a third stacked integrated circuit device $330_3$) may be electrically attached to the stacked high-density interconnection structure 310. The first stacked integrated circuit device $330_1$, the second stack integrated circuit device $330_2$, and third stacked integrated circuit device $330_3$ (as well as any further integrated circuit devices that may be utilized) may be any appropriate device, including, but not limited to, a microprocessor, a chipset, a graphics device, a wireless device, a memory, device, an application specific integrated circuit device, a field-programmable gate array device, a chiplet, combinations thereof, stacks thereof, and the like.

As further shown in FIG. 1, the first stacked integrated circuit device $330_1$, the second stacked integrated circuit device $330_2$, and the third stacked integrated circuit device $330_3$ may be electrically attached to the stacked high-density interconnection structure 310 through a plurality of stacked device-to-structure interconnects 340, such as reflowable solder bumps or balls, in a configuration generally known as a flip-chip or controlled collapse chip connection ("C4") configuration. The stacked device-to-structure interconnects 340 may extend between bond pads (not shown) of the first stacked integrated circuit device $330_1$, the second stacked integrated circuit device $330_2$, and the third stacked integrated circuit device $330_3$, and corresponding bond pads (not shown) of the stacked high-density interconnection structure 310 to form electrical connections therebetween. It is understood that the stacked device-to-structure interconnects 340 may be in electrical communication with integrated circuitry (not shown) within the first stacked integrated circuit device $330_1$, may be in electrical communication with integrated circuitry (not shown) within the second stacked integrated circuit device $330_2$, and may be in electrical communication with integrated circuitry (not shown) within the third stacked integrated circuit device $330_3$.

The stacked device-to-structure interconnects 340 may be any appropriate electrically conductive material or structure, including but not limited to, solder balls, metal bumps or pillars, metal filled epoxies, or a combination thereof. In one embodiment, the stacked device-to-structure interconnects 340 may be solder balls formed from tin, lead/tin alloys (for example, 63% tin/37% lead solder), and high tin content alloys (e.g. 90% or more tin—such as tin/bismuth, eutectic tin/silver, ternary tin/silver/copper, eutectic tin/copper, and similar alloys). In another embodiment, the stacked device-to-structure interconnects 340 may be copper bumps or pillars. In a further embodiment, the stacked device-to-structure interconnects 340 may be metal bumps or pillars coated with a solder material.

Figure 4:
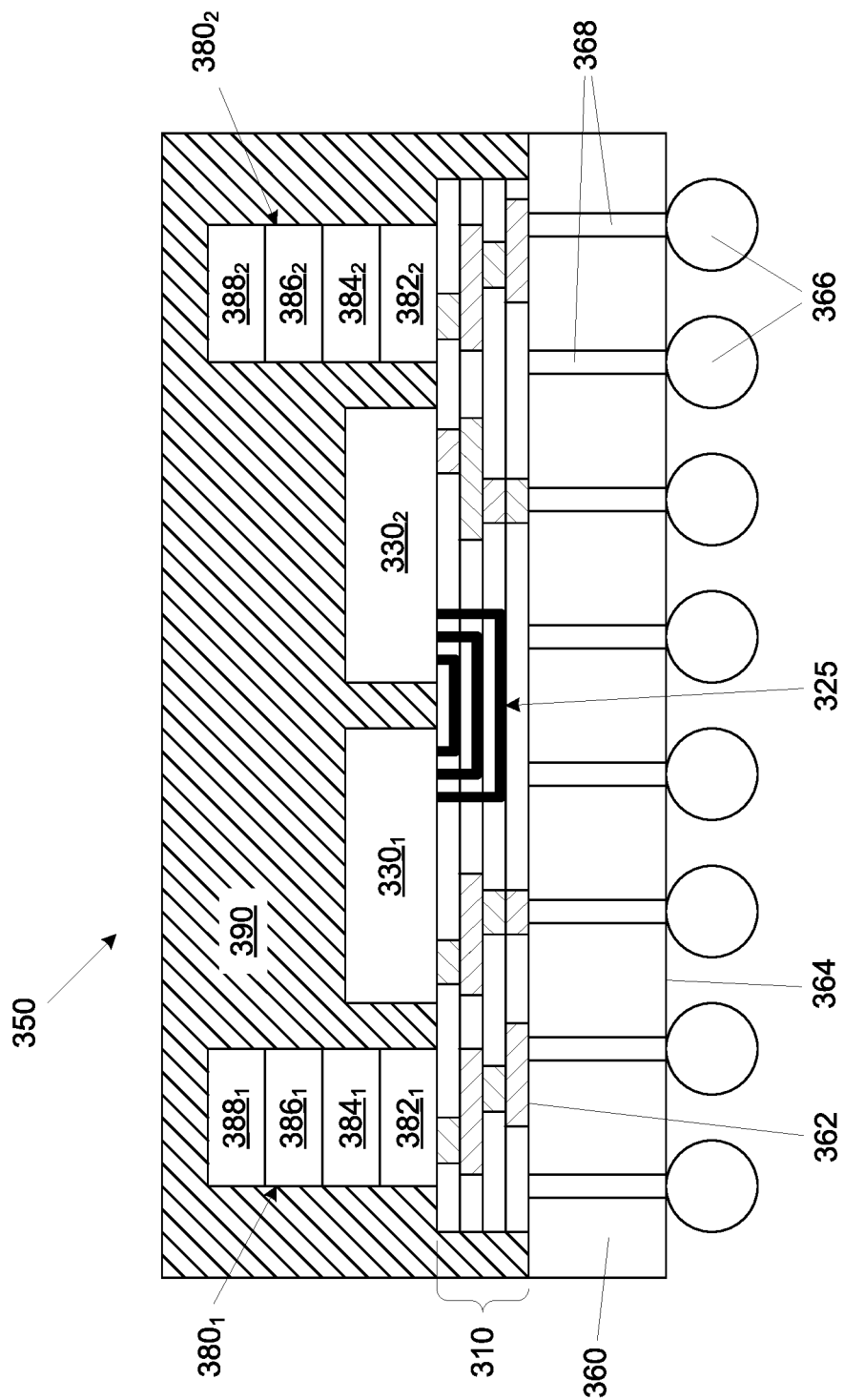
FIG. 4 is a side cross-sectional view of a stacked high-density interconnection structure in a package module, according to an embodiment of the present description.

In another embodiment of the present description, the stacked high-density interconnection structure 310 may be incorporated into package modules 350 rather than being formed to abut the outer surface 192 of the mold material layer 190, the back surface 184 of the first die side integrated circuit device $180_1$, and the back surface 184 of the second die side integrated circuit device $180_2$. FIG. 4 illustrates a package module 350 comprising the stacked high-density interconnection structure 310 formed on a first surface 362 of a support structure 360. The support structure 360 may have a plurality of module-to-device interconnects 366 on a second surface 364 thereof, wherein the support structure 360 may have conductive routes 368 electrically connecting the stacked high-density interconnection structure 310 to the module-to-device interconnects 366. The support structure 360 may be any appropriate substrate including, but not limited to, a silicon substrate, an organic substrate, a glass substrate, and the like. The conductive routes 368 may be any appropriate structure including but not limited to through-silicon vias.

As further shown in FIG. 4, at least one module integrated circuit device (illustrated as the first stacked integrated circuit device $330_1$ the second stacked integrated circuit device $330_2$, a first die stack $380_1$, and a second die stack $380_2$) may be electrically attached to the electronic interposer 310. The first die stack $380_1$ may comprise a plurality of stacked integrated circuit devices (illustrated as a first stacked device $382_1$, a second stacked device $384_1$, a third stacked device $386_1$, and a fourth stacked device $388_1$). In the one embodiment, the first stacked device $382_1$, the second stacked device $384_1$, the third stacked device $386_1$, and the fourth stacked device $388_1$ may be memory devices, which form a first high bandwidth memory stack. Additionally, the second die stack $380_2$ may comprise a plurality of stacked integrated circuit devices (illustrated as a first stacked device $382_2$, a second stacked device $384_2$, a third stacked device $386_2$, and a fourth stacked device $388_2$). In the one embodiment, the first stacked device $382_2$, the second stacked device $384_2$, the third stacked device $386_2$, and the fourth stacked device $388_2$ may be memory devices, which form a second high bandwidth memory stack.

As also shown in FIG. 4, the package module 350 may further include high-density device-to-device conductive routes 325 within the stacked high-density interconnection structure 310 that provide electrical communication between the first stacked integrated circuit device $330_1$ and the second stacked integrated circuit device $330_2$. It is understood that the high-density device-to-device conductive routes 325 of FIG. 4 may also be formed within the stacked high-density interconnection structure 310 shown in FIG. 1.

As further shown in FIG. 4, the at least one module integrated circuit device (i.e. the first stacked integrated circuit device $330_1$ the second stacked integrated circuit device $330_2$, the first die stack $380_1$, and the second die stack $380_2$) of the package module 350 may be at least partially encased in a package mold material 390, such as an epoxy material.

Figure 5:
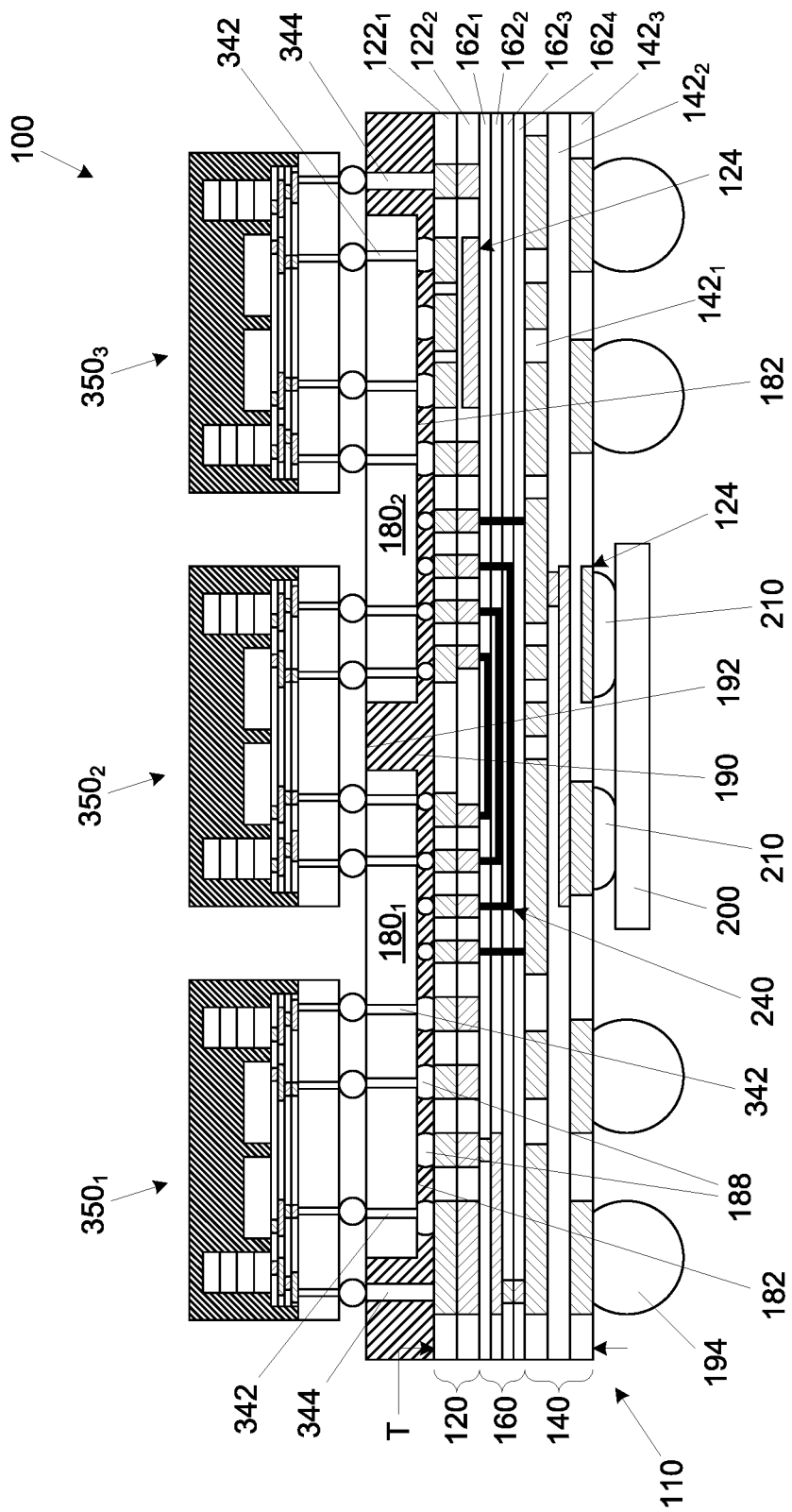
FIG. 5 is a side cross-sectional view of an integrated circuit package incorporating the package module of FIG. 4, according to an embodiment of the present description.

As shown in FIG. 5, at least one package module (illustrated as a first package module $350_1$, a second package module $350_2$, and a third package module $350_3$) may be electrically attached to at least one through-silicon via 342 extending from the back surface 184 of the first die side integrated circuit device $180_1$ and/or the back surface 184 of the second die side integrated circuit device $180_2$ to form electrical communication route therebetween, and may be in electrical contact with at least one through-mold via 344 extending through the mold material layer 190 to form an electrical communication route between the package modules (e.g. first package module $350_1$ and the third package module $350_3$) and the electronic interposer 110.

As shown in FIG. 1, the electronic interposer 110 may be formed having an upper section 120, a lower section 140, and a middle section 160 between the upper section 120 and the lower section 140. In one embodiment, the total thickness T of the electronic interposer 110 may be between about 30 microns and 100 microns.

Figure 10:
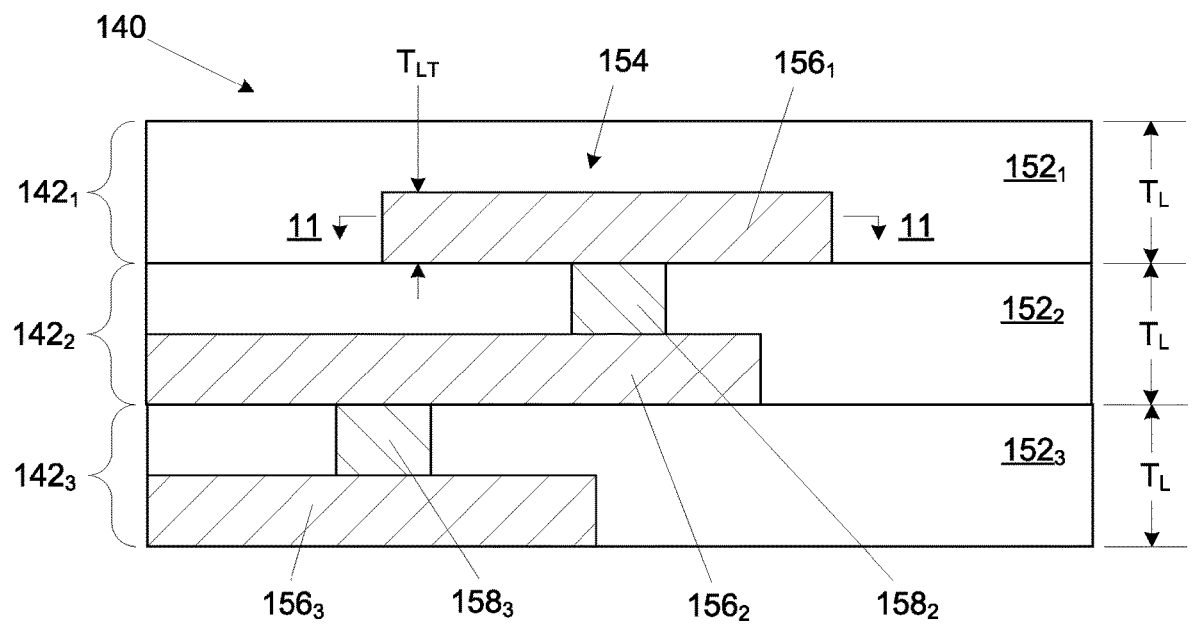
FIG. 10 is a side cross-sectional view of the lower section of the electronic interposer of FIG. 1, according to an embodiment of the present description.

As further shown in FIG. 1, a plurality of external interconnects 194 may be attached to the lower section 140 of the electronic interposer 110 for the attachment thereof to external components (not shown), such as a motherboard or other such substrate. The external interconnects 194 may extend fro bond pads (shown as a portion of conductive traces $156_3$ of FIG. 10, as will be discussed) on the lower section 140 of the electronic interposer 110. In one embodiment, the external interconnects 194 may be solder balls in a ball grid array having a pitch of less than or equal to about 400 microns. In another embodiment, the external interconnects 194 may be lands in a land grid array having a pitch of less than or equal to about 1 millimeter.

In a further embodiment, at least one land side integrated circuit device 200 may be electrically attached to the lower section 140 of the electronic interposer 110. The land side integrated circuit device 200 may be passive or active, as will be understood to those skilled in the art. In one embodiment, the at least one land side integrated circuit device 200 may be a voltage regulator for at least one of the first die side integrated circuit device $180_1$ and the second die side integrated circuit device $180_2$. As shown in FIG. 1, the land side integrated circuit device 200 may be attached to the lower section 140 of the electronic interposer 110 through a plurality of land side device-to-interposer interconnects 210, such as a solder material. The land side device-to-interposer interconnects 210 may extend between bond pads (not shown) of the at least one land side integrated circuit device 200 and corresponding bond pads (shown as a portion f conductive traces $156_3$ of FIG. 10, as will be discussed) on the lower section 140 of the electronic interposer 110 to form electrical connections therebetween. It is understood that the land side device-to-interposer interconnects 210 may be in electrical communication with integrated circuitry (not shown) within the at least one land side integrated circuit device 200.

Figure 6:
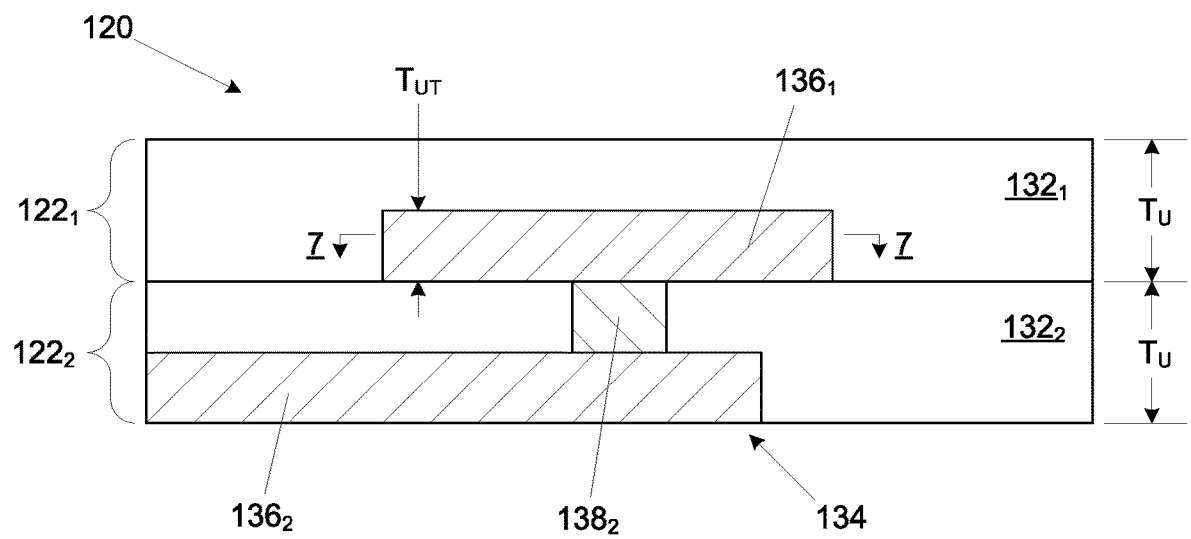
FIG. 6 is a side cross-sectional view of the upper section of the electronic interposer of FIG. 1, according to an embodiment of the present description.
Figure 7:
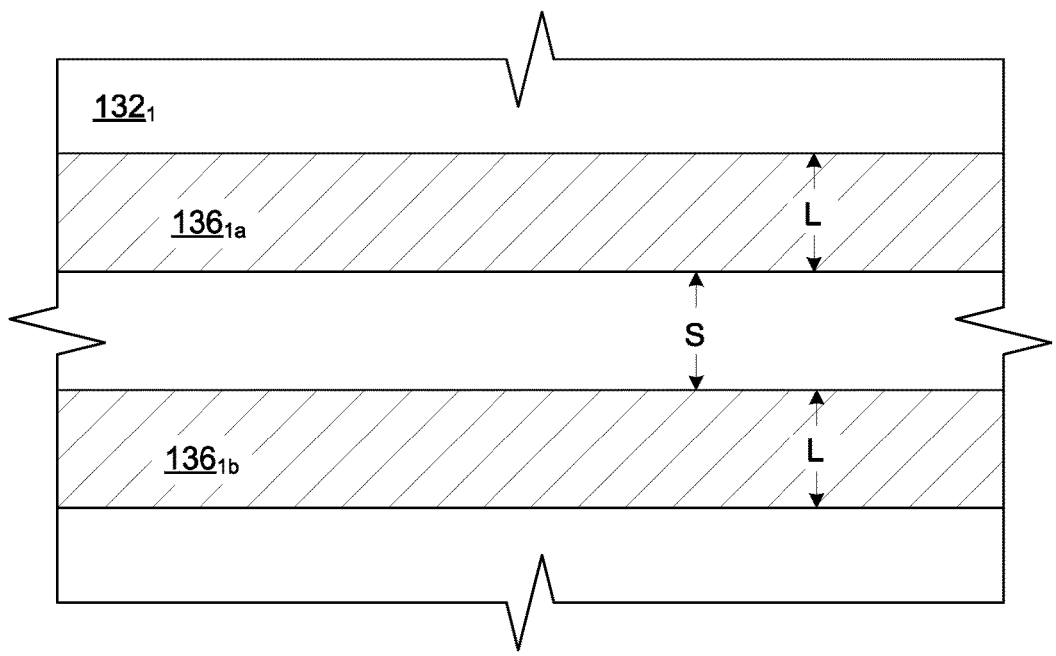
FIG. 7 is a side cross-sectional view along line 7-7 of FIG. 6, according to one embodiment of the present description.

In one embodiment shown in FIG. 1, the upper section 120 may include at least two layers, illustrated as a first layer $122_1$ and a second layer $122_2$. In an embodiment, the upper section 120 has between two and four layers. In an embodiment shown in FIG. 6, the first layer $122_1$ and the second layer $122_2$ may each have a thickness $T_U$ of between about 13 and 40 microns. In another embodiment shown in FIG. 6, the first layer $122_1$ and the second layer $122_2$ may each comprise a first organic dielectric material layer $132_1$ and a second organic dielectric material layer $132_2$, each dielectric layer can be comprised of the same or different material, respectively, and at least one conductive route 134, comprising at least one first conductive trace $136_1$ within the first organic dielectric material layer $132_1$, at least one second conductive trace $136_2$ within the second organic dielectric material layer $132_2$ and at least one conductive via $138_2$ electrically connecting the at least one first conductive trace $136_1$ and the at least one second conductive trace $136_2$. In one embodiment, the at least one first conductive trace $136_1$ may have a thickness $T_{UT}$ of between about 8 and 15 microns. In a further embodiment, shown in FIG. 7, the conductive traces (shown as first conductive traces $136_{1a}$ and $136_{1b}$) in one of the dielectric material layers (shown as first organic dielectric material layer $132_1$) may have a line width L of about 8 microns or greater, and a line spacing S of about 8 microns or greater. The at least one first conductive trace $136_1$, the at least one second conductive trace $136_2$, and the at least one conductive via 138 may be made of any appropriate conductive material, including but not limited to, metals, such as copper, silver, nickel, gold, and aluminum, alloys thereof, and the like. The conductive vias 138 can be formed by any appropriate process known in the art, including, but not limited to, lithographically defined vias, zero-misalignment vias (described in, for example, U.S. Pat. No. 9,713,264), self-aligned vias (described in, for example, U.S. Patent Publication No. 2018/0233431 A1), or the like. In one embodiment, at least one passive component 124, such as a thin film capacitor may be formed in the upper section 120 of the electronic interposer 110.

Figure 8:
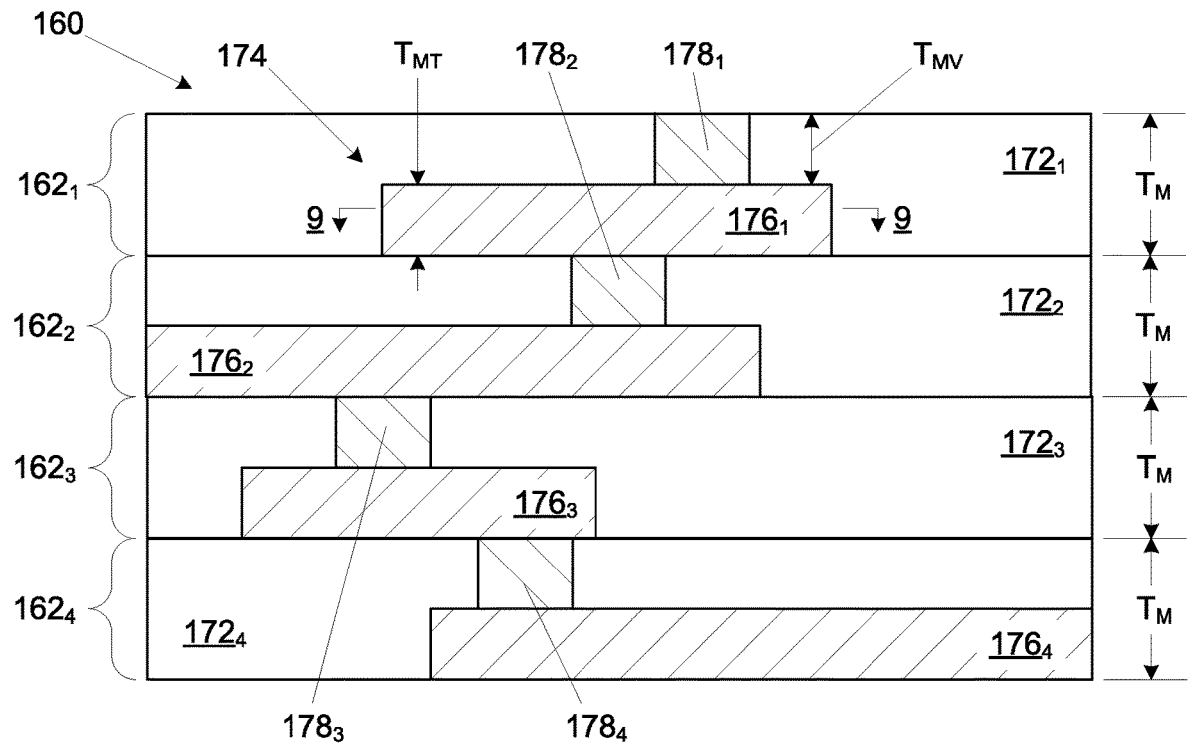
FIG. 8 is a side cross-sectional view of the middle section of the electronic interposer of FIG. 1, according to an embodiment of the present description.
Figure 9:
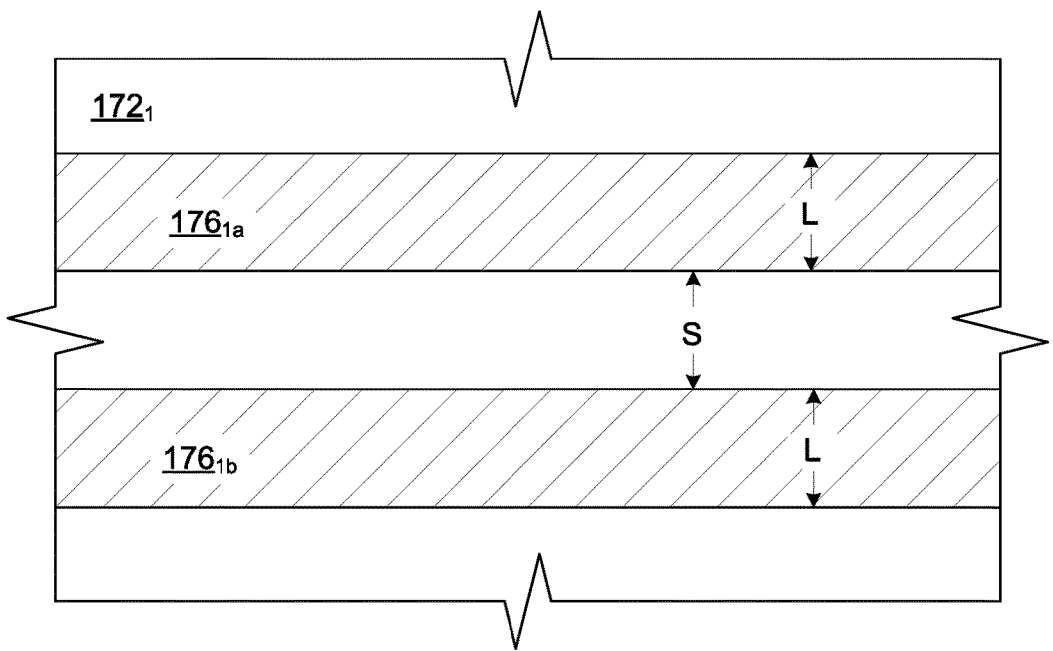
FIG. 9 is a side cross-sectional view along line 9-9 of FIG. 8, according to one embodiment of the present description.

In one embodiment shown in FIG. 1, the middle section 160 may include up to eight layers, i.e. between one and eight layers, illustrated as four layers, i.e. layers $162_1$ through $162_4$. In an embodiment shown in FIG. 8, each of the layers (e.g. layers $162_1$-$162_4$) of the middle section 160 may have a thickness $T_M$ of between about 1.5 and 9 microns. In another embodiment, each of the layers $162_1$-$162_4$ may comprise at least one organic dielectric material layer $172_1$-$172_4$, and at least one conductive route 174, comprising at least one conductive trace $176_1$-$176_4$ and at least one conductive via $178_1$-$178_4$. In an embodiment, the organic dielectric material layers $172_1$-$172_4$, may be one or more types of dielectric layers. In one embodiment, the at least one conductive trace $176_1$-$176_4$ may have a thickness TMT of between about 0.5 and 4 microns, and at least one conductive via $178_1$-$178_4$ may have a thickness $T_{MV}$ of between about 1 and 6 microns. In a further embodiment, shown in FIG. 9, the conductive traces (shown as conductive traces $176_{1a}$ and $176_{1b}$) in one of the organic dielectric material layers (shown as first organic dielectric material layer $172_1$) may have a line width L of between about 0.75 microns and 3 microns, and a line spacing S of between about 0.75 microns and 3 microns. As will be understood to those skilled in the art, the middle section 160 may be used primarily as a routing layer. It is further understood that at least one of the layers $162_1$-$162_4$ of the middle section 160 may be used for ground shielding between any of the layers $162_1$-$162_4$ of the middle section 160. The at least one conductive trace $176_1$-$176_4$ and the at least one conductive via $178_1$-$178_4$ may be made of any appropriate conductive material, including but not limited to, metals, such as copper, silver, nickel, gold, and aluminum, alloys thereof, and the like. The conductive vias $178_1$-$178_4$ can be formed by any appropriate process known in the art, including, but not limited to, lithographically defined vias, zero-misalignment vias, self-aligned vias, or the like.

Figure 11:
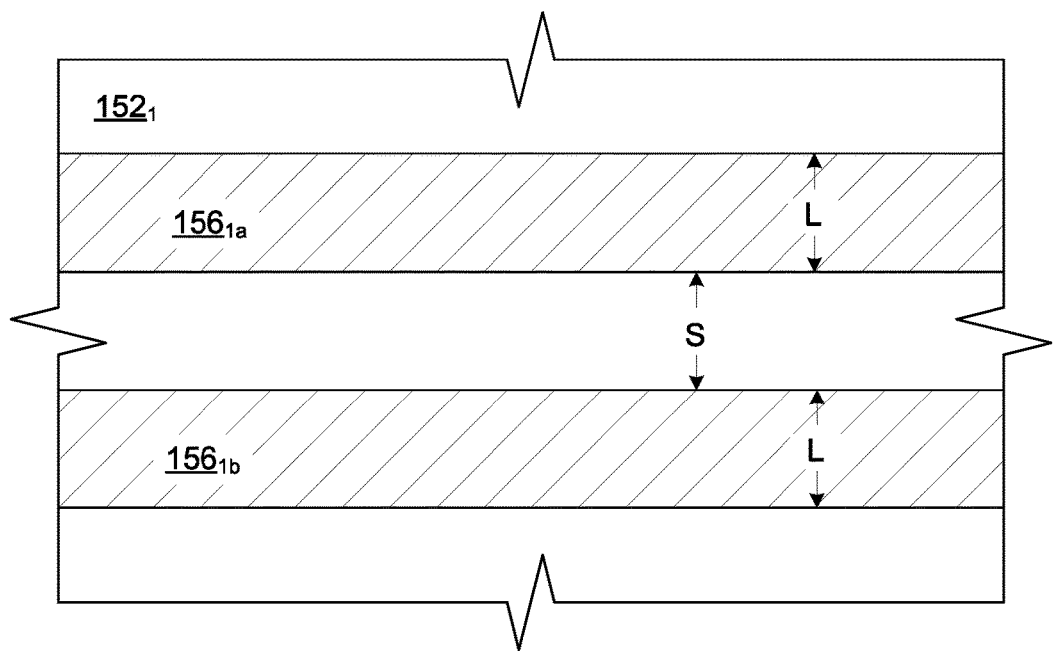
FIG. 11 is a side cross-sectional view along line 7-7 of FIG. 6, according to one embodiment of the present description.

In one embodiment shown in FIG. 1, the lower section 140 may include at least two layers, illustrated as a first layer $142_1$, a second layer $142_2$, and a third layer $142_3$. In a specific embodiment, the lower section 140 has between two and four layers. In an embodiment shown in FIG. 10, the first layer $142_1$, the second layer $142_2$, and the third layer $142_3$ may each have a thickness $T_L$ of between about 13 and 40 microns. In another embodiment shown in FIG. 10, the first layer $142_1$, the second layer $142_2$, and the third layer $142_3$ may comprise a first organic material layer $152_1$, a second organic dielectric material layer $152_2$, and a third organic dielectric material layer $152_3$, each dielectric layer can be comprised of the same or different material, respectively, and at least one conductive route 154, comprising at least one first conductive trace $156_1$, at least one second conductive trace $156_2$, and at least one third conductive trace $156_3$, wherein at least one conductive via $158_2$ electrically connects the at least one first conductive trace $156_1$ and the at least one second conductive trace $156_2$, and wherein at least one conductive via $158_3$ electrically connects the at least one second conductive trace $156_2$ and the at least one third conductive trace $156_3$. In one embodiment, the at least one first conductive trace $156_1$ may have a thickness $T_{LT}$ of between about 8 and 15 microns. In a further embodiment, shown in FIG. 11, the conductive traces (shown as conductive traces $156_{1a}$ and $156_{1b}$) in one of the organic dielectric layers (shown as first organic dielectric layer $152_1$) may have a line width L of about 8 microns or greater, and a line spacing S of about 8 microns or greater. The at least one conductive trace $156_1$, $156_2$, $156_3$ and the at least one conductive via $158_2$, $158_3$ may be made of any appropriate conductive material, including but not limited to, metals, such as copper, silver, nickel, gold, and aluminum, alloys thereof, and the like. The conductive vias $158_2$, $158_3$ can be formed by any appropriate process known in the art, including, but not limited to, lithographically defined vias, zero-misalignment vias, self-aligned vias, or the like. In one embodiment, as shown in FIG. 1, at least one passive component 124, such as a thin film capacitor may be formed in the lower section 140 of the electronic interposer 110.

As previously discussed, the electronic interposer 110 may be an organic interposer, meaning that the electronic interposer 110 uses organic-based materials as its dielectric layers. These organic dielectric materials may be composites that consist of an organic matrix and filler particles. The organic matrix may comprise any appropriate polymer, including but not limited to epoxy polymers, polyimides, and the like. In one embodiment, the organic dielectric materials may be buildup films, as known in the art, that can be laminated onto a wafer or onto a glass-panel (or any other carrier substrate). In another embodiment, the organic dielectric materials may be supplied in liquid form and then dispensed through nozzles in a spin-coating process (such as for round wafer-format carriers) or by slit-coating (such as for square format panels). The organic dielectric materials may have coefficients of thermal expansion of between about 9 and 25 ppm/° C. and may have elastic moduli of between about 1 and 20 GPa. It is understood that the organic dielectric materials need not be photo-imagable or filled. The filler particles may be any appropriate filler, including, but not limited to, silicon dioxide particles, carbon-doped oxide particles, various known low-k dielectric particles (dielectric constants less than about 3.6), and the like.

Figure 12:
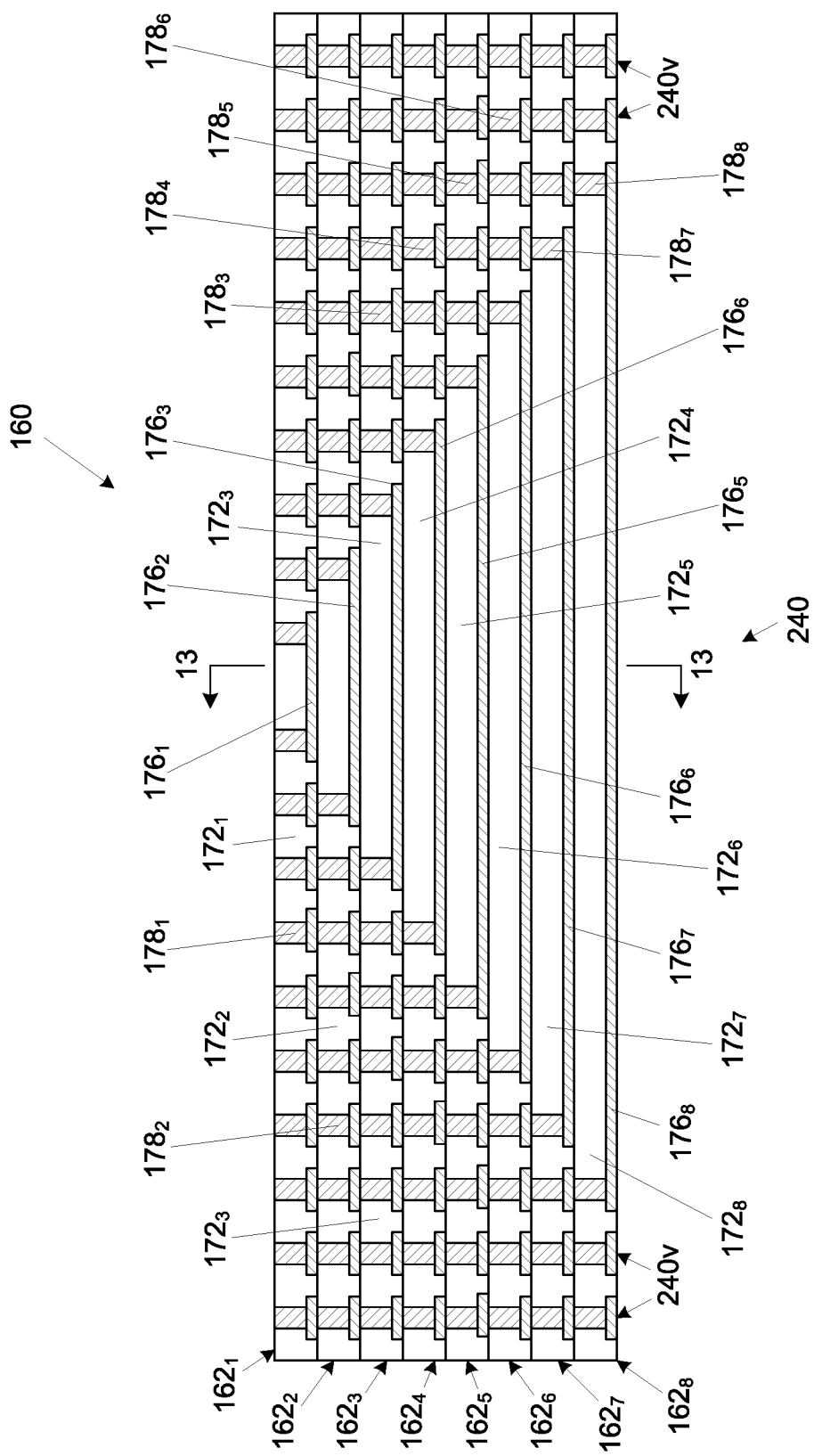
FIG. 12 is a side cross-sectional view of high-density device-to-device conductive routes, according to one embodiment of the present description.

As further shown in FIG. 1, the electronic interposer 110 may further include high-density device-to-device conductive routes 240 within the middle section 160 that provides electrical communication between the first integrated circuit device $180_1$ and the second integrated circuit device $180_2$. FIG. 12 provides a closer view of the high-density device-to-device conductive routes 240 with an eight-layer middle section 160 (i.e. layers $162_1$-$162_8$). The high-density device-to-device conductive routes 240 are fabricated from the conductive traces $176_1$-$176_8$ and the conductive vias $178_1$-$178_8$ during the fabrication of the middle section 160 of the electronic interposer 110. As further shown in FIG. 12, the high-density device-to-device conductive routes 240 may include high-density vertical interconnects 240v (e.g. stacked vias) for electrical interconnection between the upper section 120 and the lower section 140 of the electronic interposer 110 (see FIG. 1).

Figure 13:
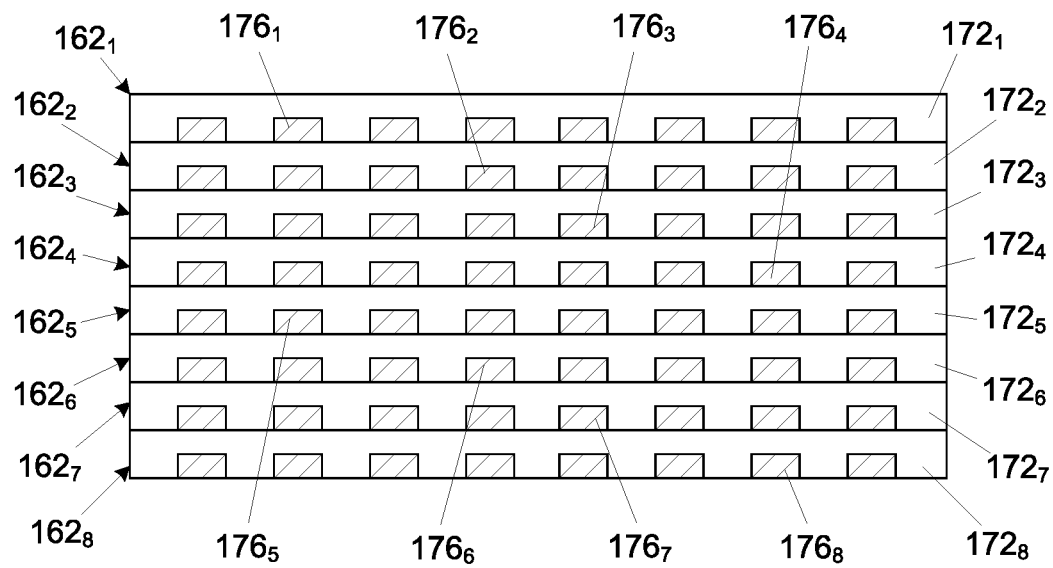
FIGS. 13-17 are side cross-sectional views of various configurations of high-density device-to-device conductive routes, according to embodiments of the present description.
Figure 14:
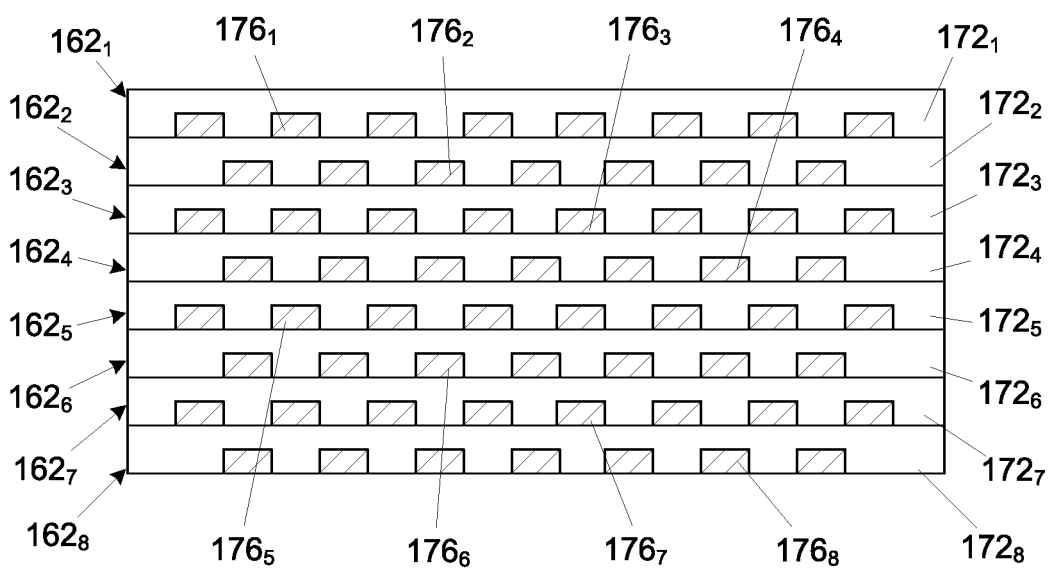
Figure 15:
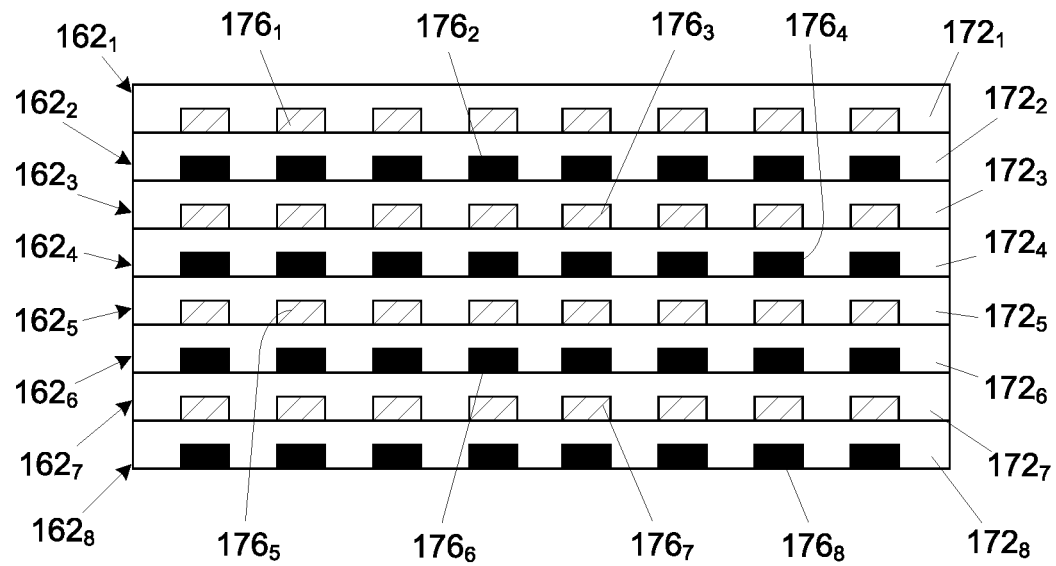
Figure 16:
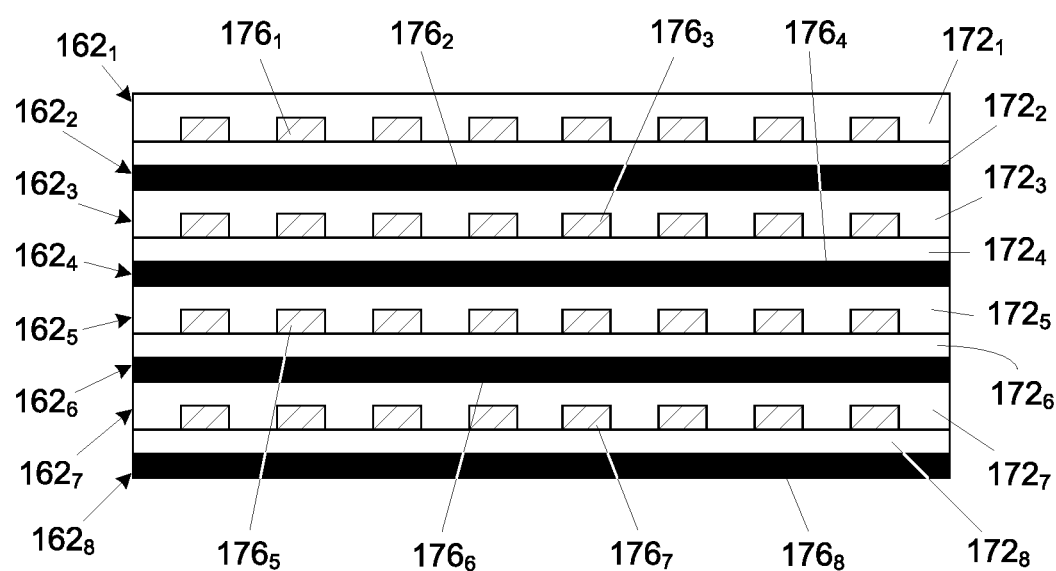
Figure 17:
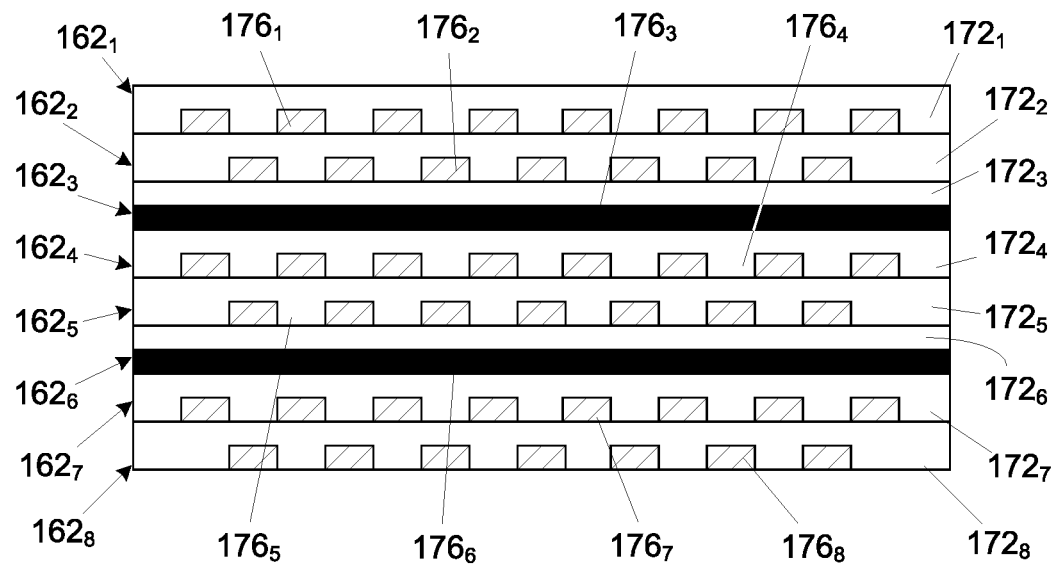

FIGS. 13-17 illustrate potential configurations of the high-density device-to-device conductive traces $176_1$-$176_8$, along line 13-13 of FIG. 12. In one embodiment, as shown in FIG. 13, all of the high-density device-to-device conductive traces $176_1$-$176_8$ may be used for signalling and are organized in ordered rows and columns. In another embodiment, as shown in FIG. 14, all of the high-density device-to-device conductive traces $176_1$-$176_8$ may be used for signalling and are organized in a staggered configuration. In an embodiment, as shown in FIG. 15, the high-density device-to-device conductive traces $176_1$-$176_8$ are organized in ordered rows and columns with the high-density device-to-device conductive traces $176_1$, $176_3$, $176_5$, and $176_7$ used for signalling and the high-density device-to-device conductive traces $176_2$, $176_4$, $176_6$, and $176_8$ used for ground/shielding. In one embodiment, as shown in FIG. 16, the high-density device-to-device conductive traces $176_1$-$176_8$ are organized in ordered rows with the high-density device-to-device conductive traces $176_1$, $176_3$, $176_5$, and $176_7$ used for signalling and the high-density device-to-device conductive traces $176_2$, $176_4$, $176_6$, and $176_8$ are formed and used as ground planes. In another embodiment, as shown in FIG. 17, all of the high-density device-to-device conductive traces $176_1$, $176_2$, $176_4$, $176s$, $176_7$, and $176_8$ may be used for signalling and are organized in a staggered configuration, and the high-density device-to-device conductive traces $176_3$ and $176_6$ are formed and used as ground planes. It is understood that the embodiments of FIGS. 12-17 apply equally to the high-density device-to-device conductive routes 325 within the stacked high-density interconnection structure 310.

Referring back to FIG. 1, the die side device-to-interposer interconnects 188 over the high-density device-to-device conductive routes 240 may have a finer pitch than the die side device-to-interposer interconnects 188 that are not over the high-density device-to-device conductive routes 240. In one embodiment, the pitch of the die side device-to-interposer interconnects 188 over the high-density device-to-device conductive routes 240 may be between about 20 and 55 microns. As will be understood to those skilled in the art, pitch translation can be implemented. It will also be understood that the die side device-to-interposer interconnects 188 can be full array of fine pitch or a combination of pitches between about 20 and 110 microns.

Figure 18:
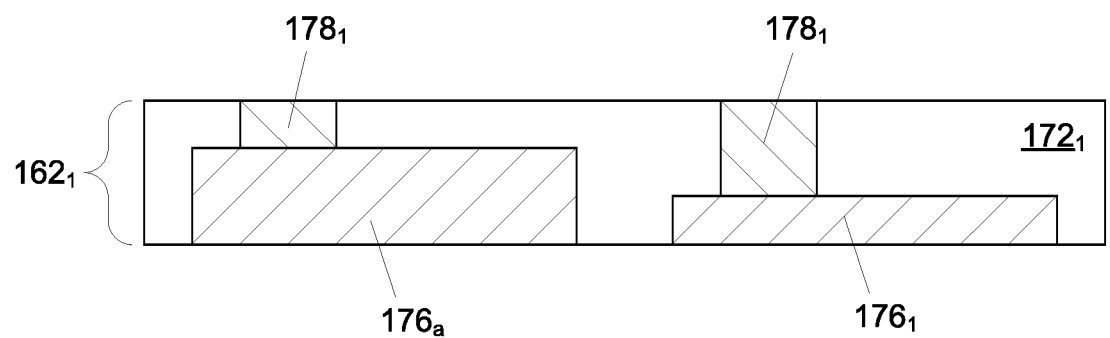
FIGS. 18-22 are side cross-sectional views of various configurations of conductive traces of the middle section having enhanced thicknesses, according to embodiments of the present description.
Figure 19:
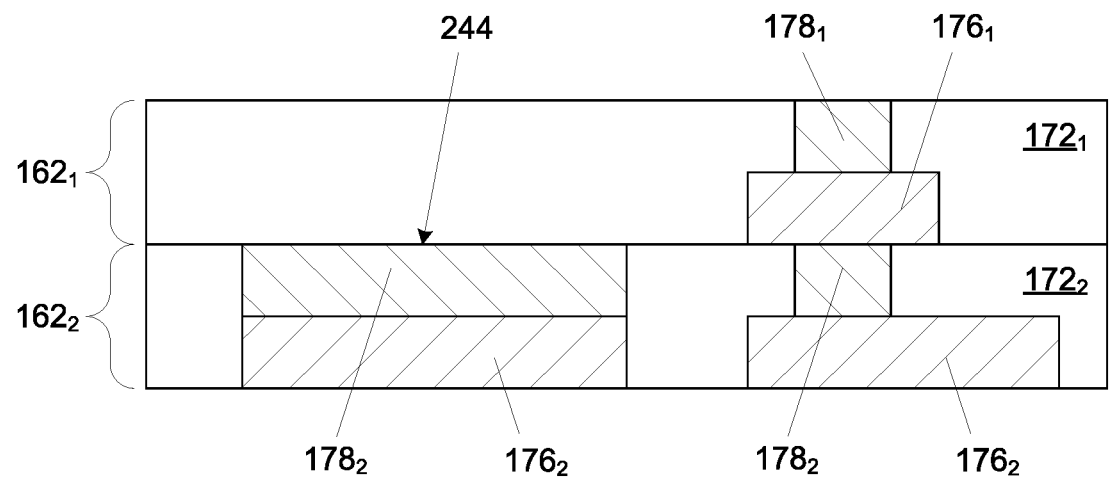

As shown in FIGS. 18-22, the middle section 160 may have at least one conductive trace 176a having an enhanced thickness, which allows general/coarse routing within the thin layers (shown as layers $162_1$, $162_2$, $162_3$, and/or $162_4$ of FIG. 1) of the middle section 160. In an embodiment, the thickened conductive traces 176a may be formed outside of the area where the high-density device-to-device conductive routes 240 (see FIG. 1) are formed (referred to herein as the "general routing area"). In one embodiment, the thickened conductive traces 176a in the middle section 160 may be formed with a thick/thin technology, as described in U.S. Patent Application Publication No. 2018/0331003 A1. When such a thick/thin technology is used, the thickness of the thickened conductive trace $176_a$ in these areas can increase from between about 1 and 7 microns resulting in shorter conductive via $178_1$ thickness between about 0.5 and 3 microns, as shown in FIG. 18 (without thickening is illustrated on the right as conductive trace $176_1$ and with thickening is illustrated on the left as conductive trace $176_a$). In another embodiment, as shown in FIG. 19, the via formation process may form the conductive via $178_2$ across the entire conductive trace $176_2$ to form a via/trace shunt 244. This allows the via/trace shunt 244 to have a thickness substantially equal to the thickness of the dielectric material layer $172_2$ and still remain at minimum critical dimension. The via/trace shunt 244 may be formed with known lithographically defined via techniques, zero-misalignment via formation techniques, self-aligned via formation techniques, or the like. As further shown in FIG. 19, the dielectric material layer $172_1$ may cover the via/trace shunt 244 to inhibit electrical shorts, as will be understood to those skilled in the art.

Figure 20:
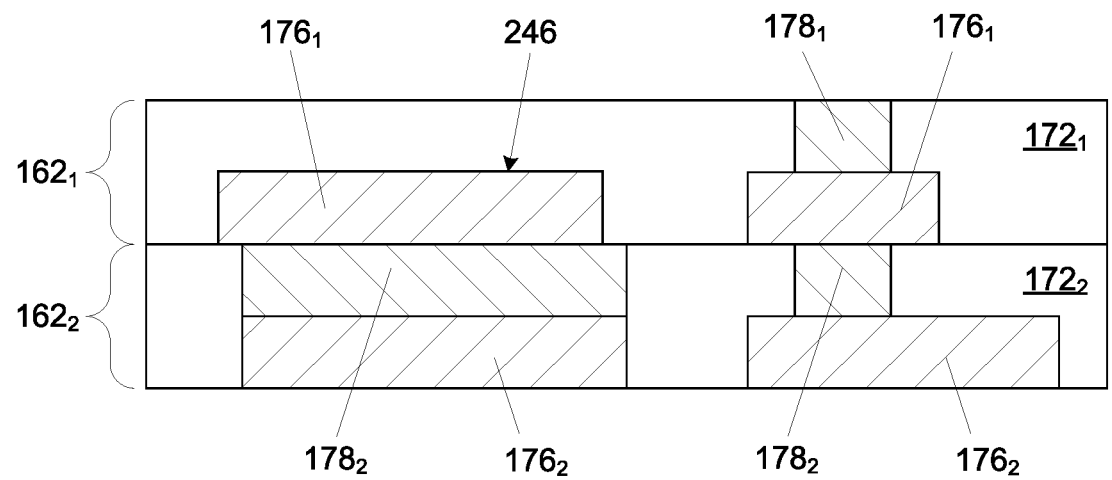
Figure 21:
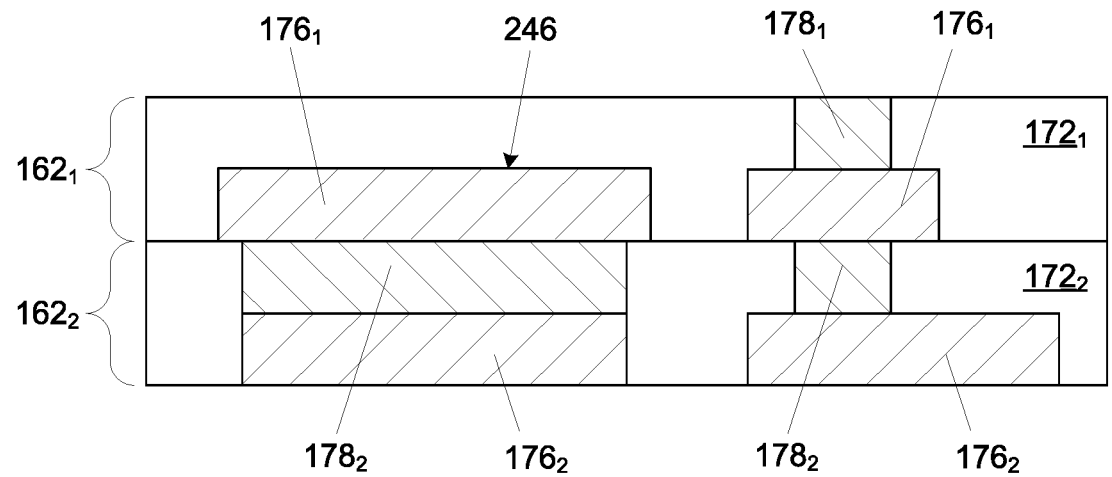
Figure 22:
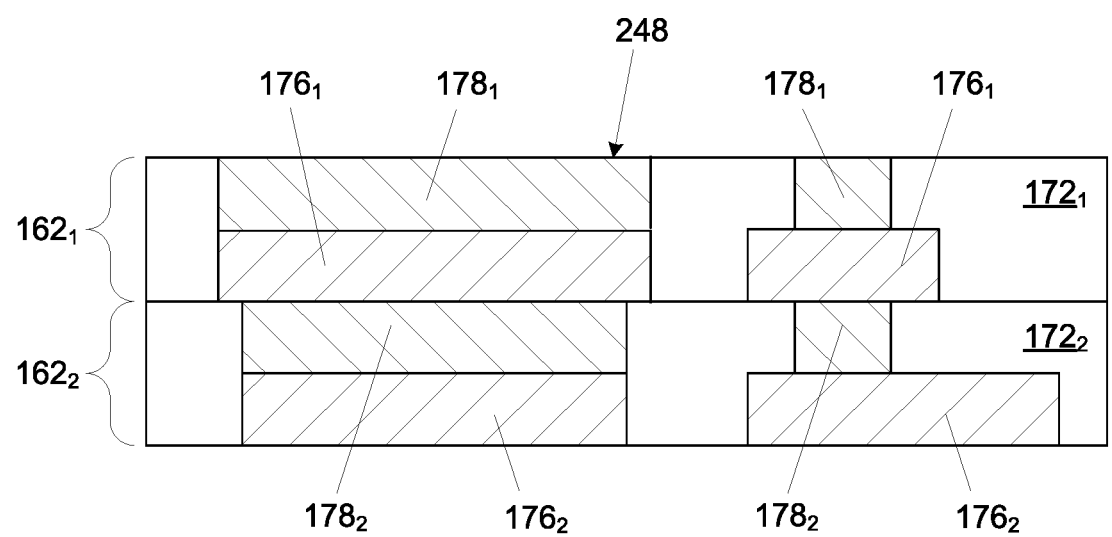

As shown in FIG. 20, the via/trace shunt 244 may be further thickened by forming another conductive trace (i.e. first conductive trace $176_1$) on the via/trace shunt 244 (see FIG. 19) to form a thickened via/trace shunt 246. The conductive trace $176_1$ may be widened relative to the via/trace shunt 244 (see FIG. 19), as shown in FIG. 21, to accommodate any registration/alignment errors. In another embodiment, as shown in FIG. 22, the via formation process may form the conductive via $178_1$ across the thickened via/trace shunt 246 (see FIG. 20) to form a double via/trace shunt 248. This allows the double via/trace shunt 248 to have a thickness substantially equal to the thickness of two dielectric material layers $172_1$ and $172_2$, and still remain at minimum critical dimension.

Figure 23:
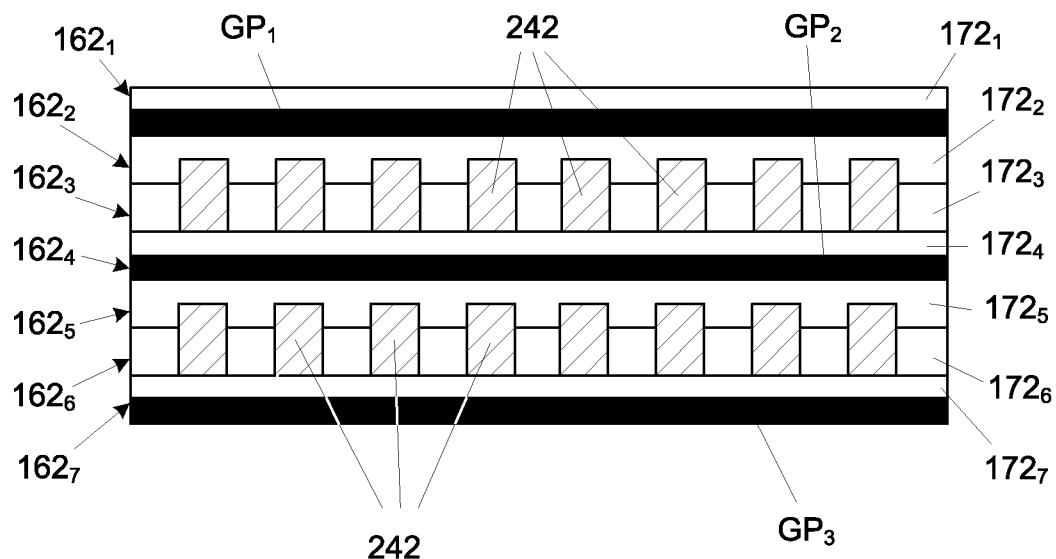
FIGS. 23 and 24 are side cross-sectional views of various configurations of high-density device-to-device conductive routes having enhanced thicknesses, according to embodiments of the present description.
Figure 24:
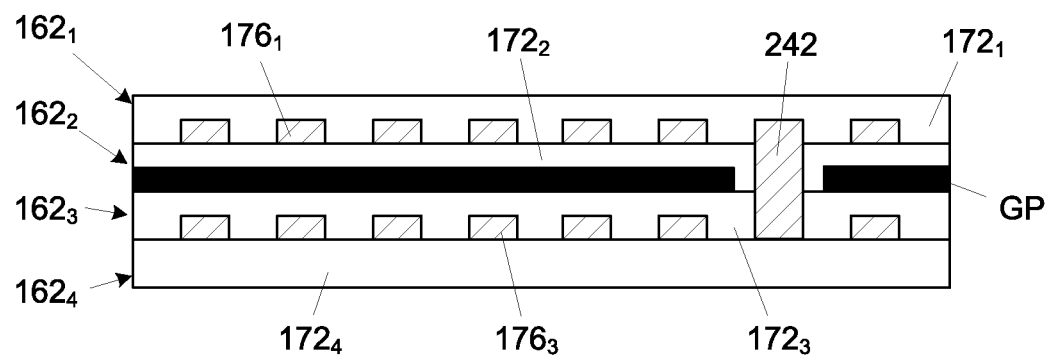

It is understood that the conductive trace thickening process it not limited to the areas outside of the high-density device-to-device conductive routes 240 (see FIG. 1) as discussed with regard to FIGS. 18-22, but may also be used within the high-density device-to-device conductive routes 240. As shown in FIG. 23, the high-density device-to-device conductive routes may extend within two dielectric layers $172_2/172_3$ and $172_5/172_6$, i.e. two actual dielectric layers to form a plurality of thickened high-density device-to-device conductive traces 242. This results in a trade-off of reduced input/output layer count for reduced losses. As also shown in FIG. 23, ground planes GP1, GP2, and GP3 may separate layers of thickened high-density device-to-device conductive traces 242. In a further embodiment shown in FIG. 24, only a portion of the high-density device-to-device conductive traces 240 may be thickened, for instance to deliver a global system signal and/or to have specific lower loss (i.e. lower resistance) traces. As shown, a single thickened trace 242 may be formed and may even extend through at least one ground plane, shown as ground plane GP. It is understood that the embodiments of FIGS. 18-24 apply equally to the high-density device-to-device conductive routes 325 within the stacked high-density interconnection structure 310 (as shown in FIG. 4).

Figure 25:
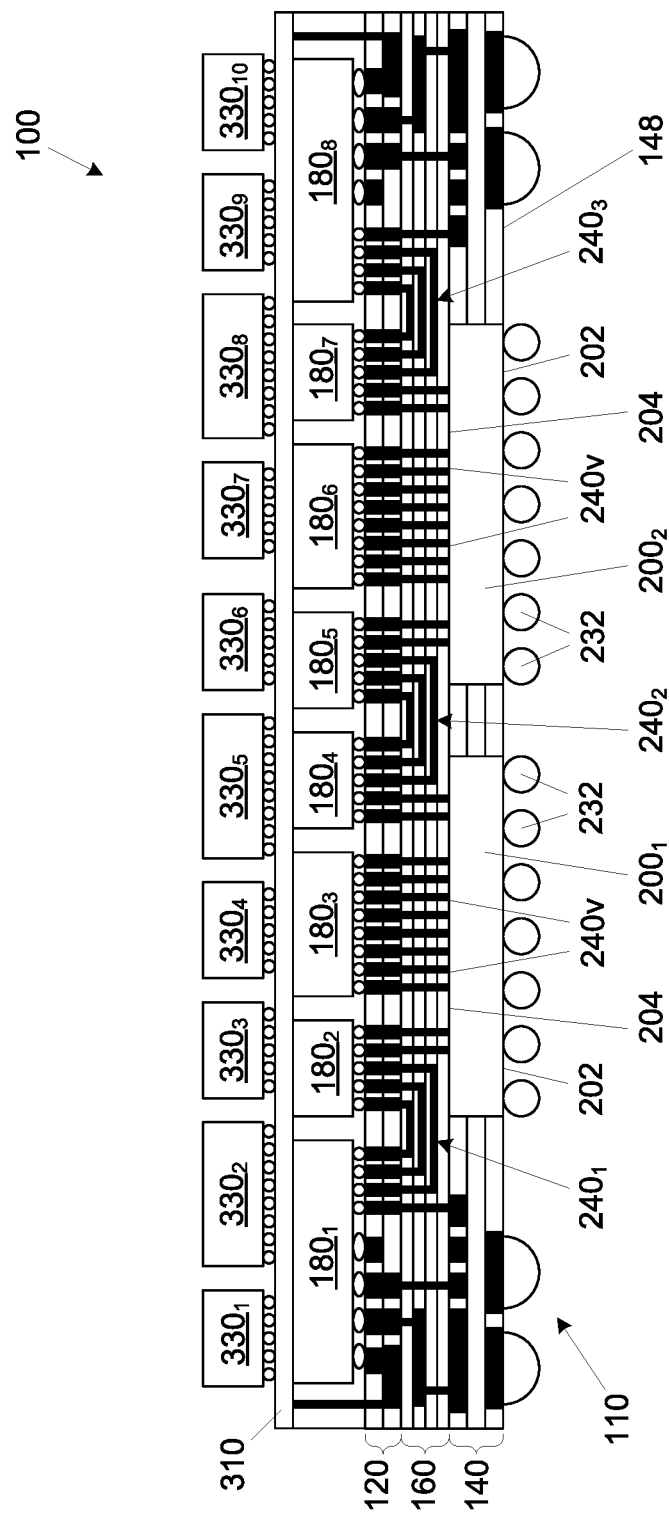
FIG. 25 is a side cross-sectional view of an integrated circuit package, according to one embodiment of the present description.
Figure 26:
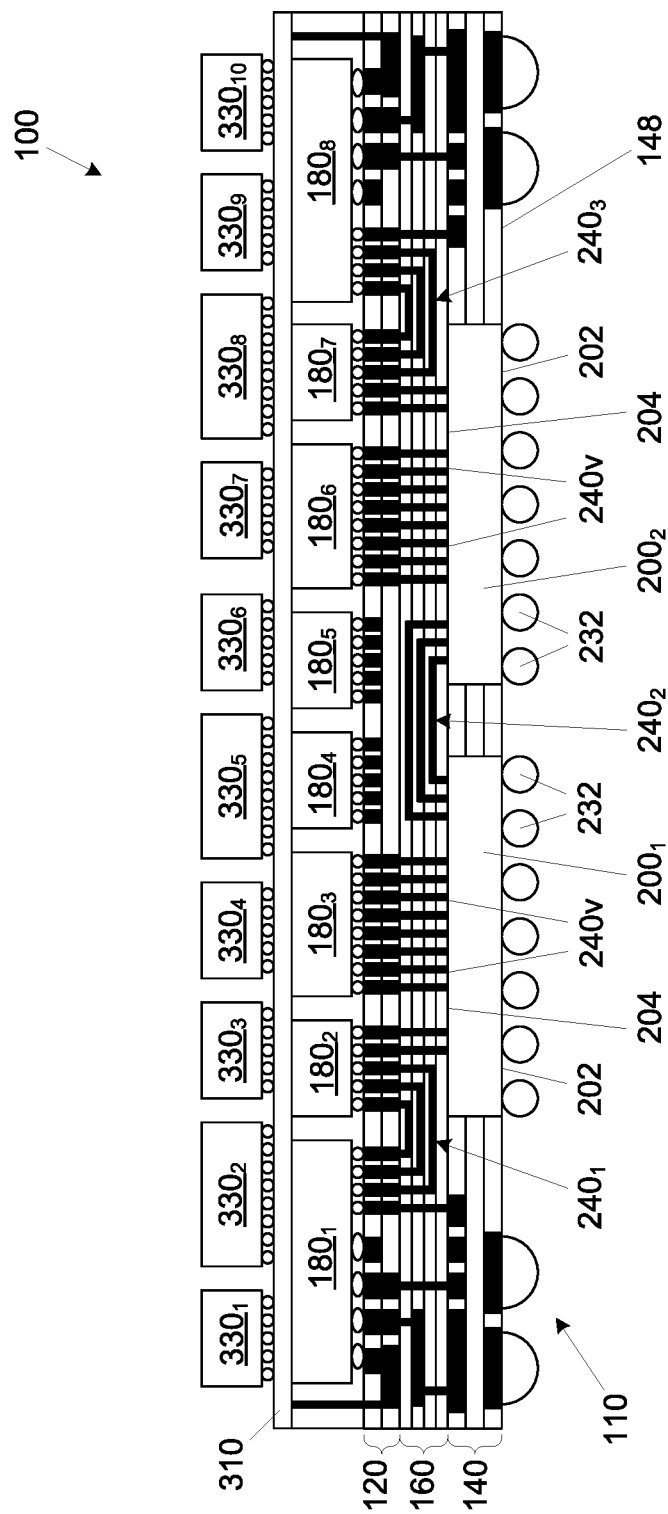
FIG. 26 is a side cross-sectional view of an integrated circuit package, according to another embodiment of the present description.

In a further embodiment as shown in FIG. 25, the at least one land side integrated circuit device 200 of FIG. 1 may be embedded in the lower section 140 of the electronic interposer 110 (illustrated as a first land side integrated circuit device $200_1$ and a second land side integrated circuit device $200_2$). In one embodiment, a first surface 202 of the first land side integrated circuit device $200_1$ and/or the second land side integrated circuit device $200_2$ may be substantially in the same plane as an outer surface 148 of the lower section 140 of the electronic interposer 110. In the illustrated embodiment, the first land side integrated circuit device $200_1$ and the second land side integrated circuit device $200_2$ may each be an active device having a plurality of device-to-substrate interconnects 232, such as solder balls, attached thereto, wherein the device-to-substrate interconnects 232 may be in electrical communication with integrated circuitry (not shown) within the first land side integrated circuit device $200_1$ and within the second land side integrated circuit device $200_2$. As shown in FIG. 25, the vertical high-density interconnects 240v can be used to electrically connect at least one of the die side integrated circuit devices with at least one of the land side integrated circuit devices, which is illustrated as die side integrated circuit devices $180_2$, $180_3$, and $180_4$ connected to the first land side integrated circuit device $200_1$, and die side integrated circuit devices $180_5$, $180_6$, and $180_7$ with the second land side integrated circuit device $200_2$. As will be understood to those skilled in the art, the vertical high-density interconnects 240v may be connected with through-silicon vias (not shown) on the back side 204 of the first land side integrated circuit device $200_1$ and the second land side integrated circuit device $200_2$, in order to make electrical contact therewith. As further shown in FIG. 25, the first die side integrated circuit device $180_1$ may be electrically connected to the second die side integrated circuit device $180_2$ with the high-density device-to-device conductive routes $240_1$, a fourth die side integrated circuit device $180_4$ may be electrically connected to a fifth die side integrated circuit device $180_5$ with the high-density device-to-device conductive routes $240_2$, and a seventh die side integrated circuit device $180_7$ may be electrically connected to an eighth die side integrated circuit device $180_8$ with the high-density device-to-device conductive routes $240_3$. It is understood that the interconnection of integrated circuit devices with high-density device-to-device conductive routes is not limited to the die side integrated circuit devices. As shown in FIG. 26, the first land side integrated circuit device $200_1$ may be electrically connected to the second land side integrated circuit device $200_2$ with high-density device-to-device conductive routes $240_2$ within the middle section 160 of the electronic interposer 110.

Figure 27:
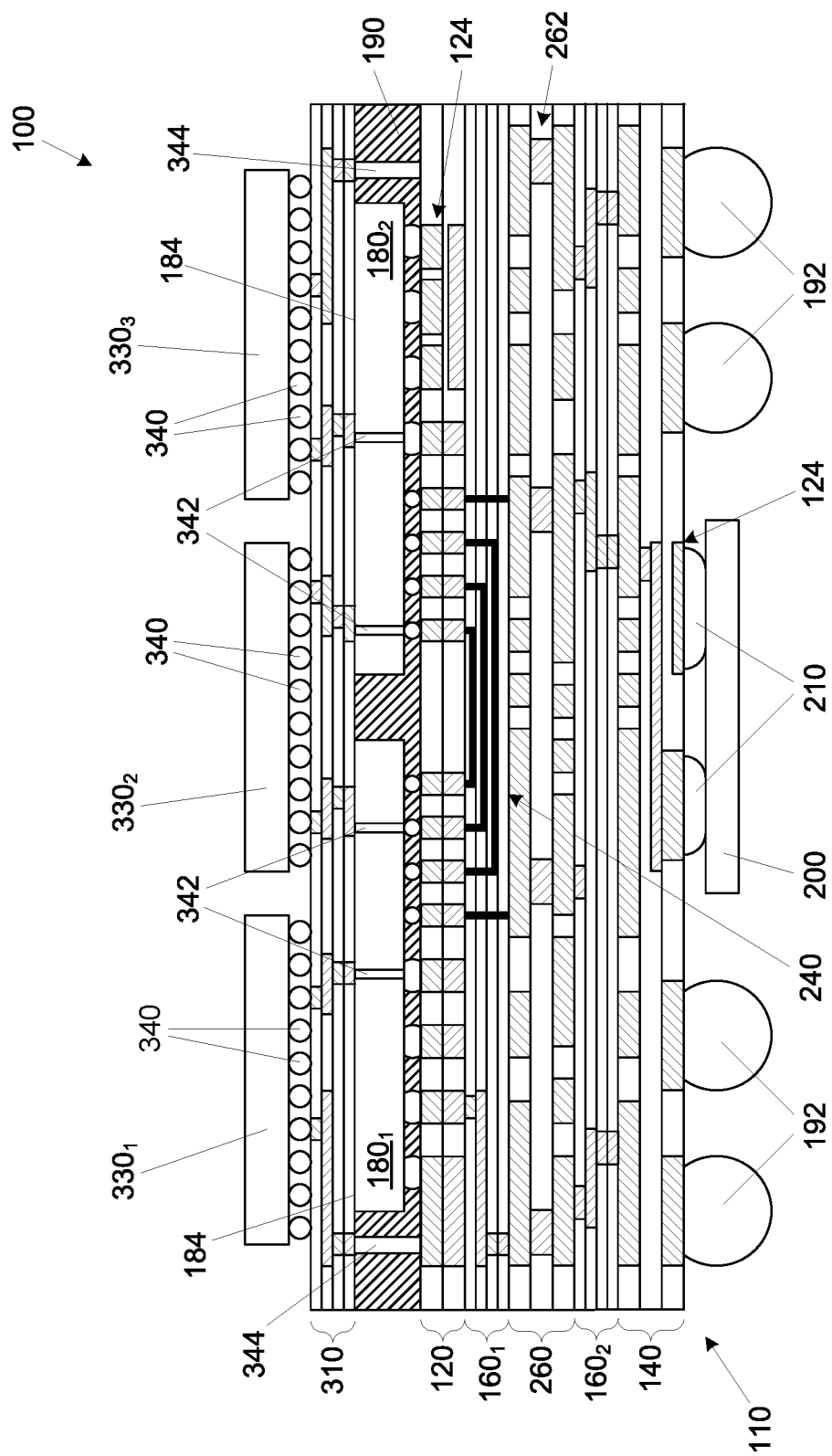
FIG. 27 is a side cross-sectional view of an integrated circuit package, according to still another embodiment of the present description.

Although the previously described embodiment of the present description show a single middle section 160, the embodiments are not so limited. For example, as shown in FIG. 27, the electronic interposer 110 may have multiple middle sections (shown as a first middle section $160_1$ and a second middle section $160_2$). The first middle section $160_1$ and the second middle section $160_2$ may be separated by a center section 260, which may be fabricated in the manner described with regard to the upper section 120 and/or the lower section 140, and which may have conductive routes 262 that form electrical connections between the first middle section $160_1$ and the second middle section $160_2$.

Although the die side integrated circuit devices and the land side integrated circuit devices may be individual silicon integrated circuit devices, the embodiments of the present description are not so limited. In one specific embodiment, at least one of the die side integrated circuit devices and the land side integrated circuit devices may be a smaller version of one embodiment of the present description.

Figure 28:
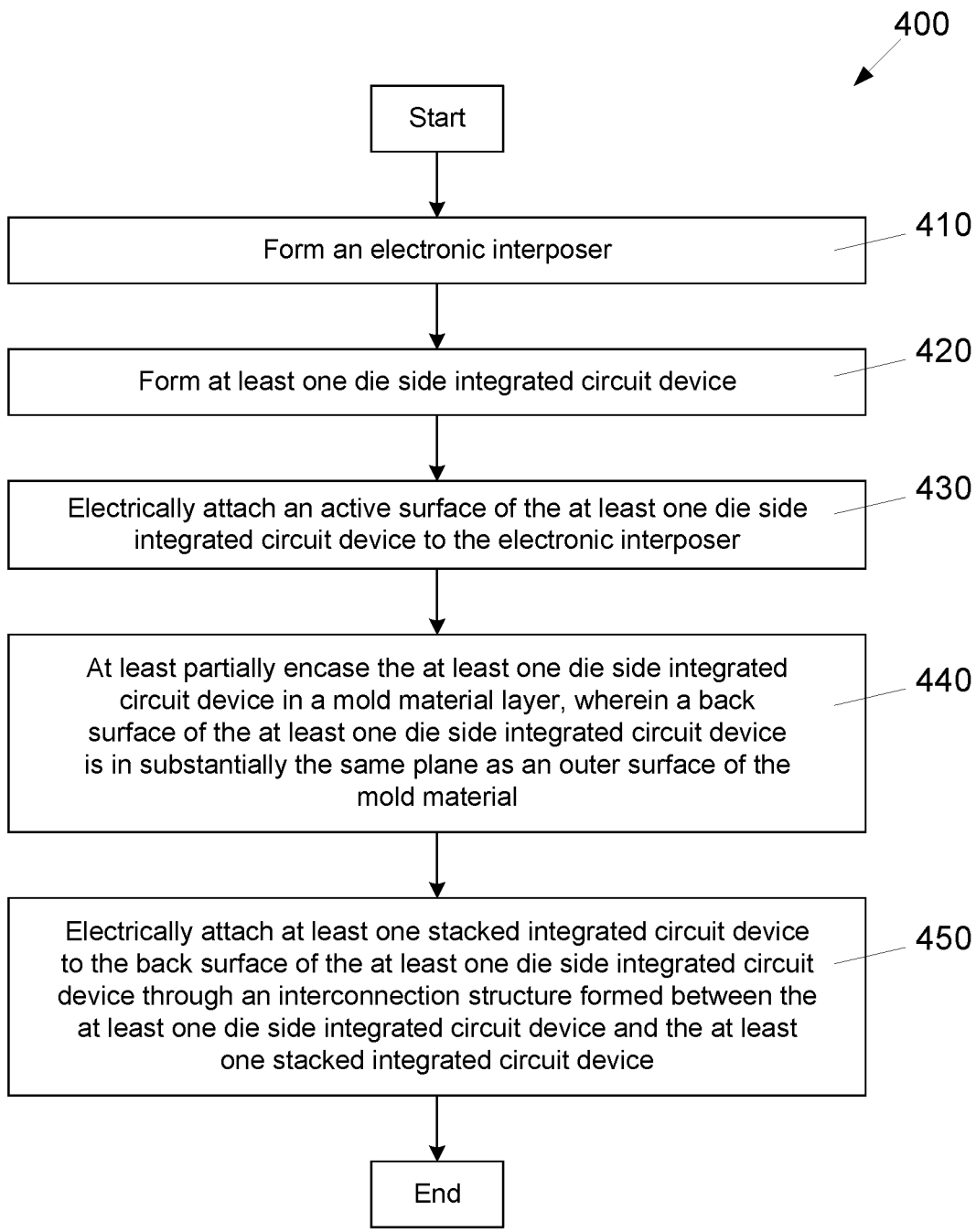
FIG. 28 is a flow diagram of a process of fabricating an integrated circuit assembly, according to an embodiment of the present description.

FIG. 28 is a flow chart of a process 400 of fabricating an integrated circuit package according to an embodiment of the present description. As set forth in block 410, an electronic interposer may be formed. At least one die side integrated circuit device may be formed, as set forth in block 420. As set forth in block 430, an active surface of the at least one die side integrated circuit device may be electrically attached to the electronic interposer. At least one die side integrated circuit device may be at least partially encased in a mold material layer, wherein a back surface of the at least one die side integrated circuit device is in substantially the same plane as an outer surface of the mold material, as set forth in block 440. As set forth in block 450, at least one stacked integrated circuit device may be electrically attached to the back surface of the at least one die side integrated circuit device through an interconnection structure formed between the at least one die side integrated circuit device and the at least one stacked integrated circuit device.

Figure 29:
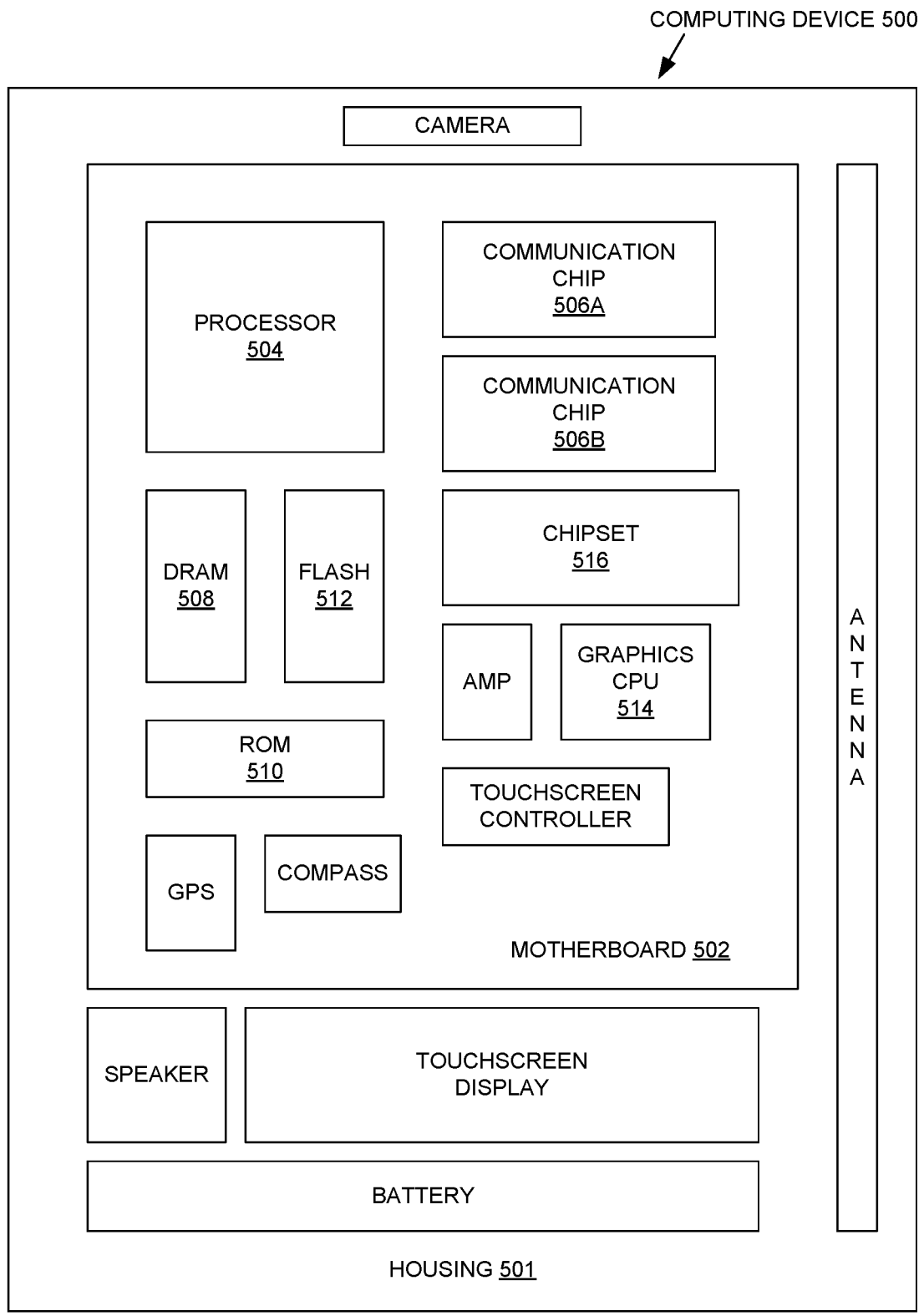
FIG. 29 is an electronic system, according to one embodiment of the present description.

FIG. 29 illustrates an electronic system or computing device 500 in accordance with one implementation of the present description. The computing device 500 may include a housing 501 having a board 502 disposed therein. The computing device 500 may include a number of integrated circuit components, including but not limited to a processor 504, at least one communication chip 506A, 506B, volatile memory 508 (e.g., DRAM), non-volatile memory 510 (e.g., ROM), flash memory 512, a graphics processor or CPU 514, a digital signal processor (not shown), a crypto processor (not shown), a chipset 516, an antenna, a display (touchscreen display), a touchscreen controller, a battery, an audio codec (not shown), a video codec (not shown), a power amplifier (AMP), a global positioning system (GPS) device, a compass, an accelerometer (not shown), a gyroscope (not shown), a speaker, a camera, and a mass storage device (not shown) (such as hard disk drive, compact disk (CD), digital versatile disk (DVD), and so forth). Any of the integrated circuit components may be physically and electrically coupled to the board 502. In some implementations, at least one of the integrated circuit components may be a part of the processor 504.

The communication chip enables wireless communications for the transfer of data to and from the computing device. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip or device may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device may include a plurality of communication chips. For instance, a first communication chip may be dedicated to shorter range wireless communications such as Wi-Fi and Bluetooth and a second communication chip may be dedicated to longer range wireless communications such as GPS, EDGE, GPRS, CDMA, WiMAX, LTE, Ev-DO, and others.

The term "processor" may refer to any device or portion of a device that processes electronic data from registers and/or memory to transform that electronic data into other electronic data that may be stored in registers and/or memory.

At least one of the integrated circuit components may include an integrated circuit package comprising an electronic interposer; at least one die side integrated circuit device having an active surface electrically attached to the electronic interposer, wherein the at least one die side integrated circuit device is at least partially encased in a mold material layer and wherein a back surface of the at least one die side integrated circuit device is in substantially the same plane as an outer surface of the mold material layer; and at least one stacked integrated circuit device electrically attached to the back surface of the at least one die side integrated circuit device through an interconnection structure formed between the at least one die side integrated circuit device and the at least one stacked integrated circuit device.

In various implementations, the computing device may be a laptop, a netbook, a notebook, an ultrabook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, or a digital video recorder. In further implementations, the computing device may be any other electronic device that processes data.

It is understood that the subject matter of the present description is not necessarily limited to specific applications illustrated in FIGS. 1-29. The subject matter may be applied to other integrated circuit devices and assembly applications, as well as any appropriate electronic application, as will be understood to those skilled in the art.

The follow examples pertain to further embodiments and specifics in the examples may be used anywhere in one or more embodiments, wherein Example 1 is an integrated circuit package comprising an electronic interposer; at least one die side integrated circuit device having an active surface electrically attached to the electronic interposer, wherein the at least one die side integrated circuit device is at least partially encased in a mold material layer and wherein a back surface of the at least one die side integrated circuit device is in substantially the same plane as an outer surface of the mold material layer; and at least one stacked integrated circuit device electrically attached to the back surface of the at least one die side integrated circuit device through an interconnection structure formed between the at least one die side integrated circuit device and the at least one stacked integrated circuit device.

In Example 2, the subject matter of Example 1 can optionally include the interconnection structure abutting the back surface of the at least one die side integrated circuit device and abutting the outer surface of the mold material layer.

In Example 3, the subject matter of Example 1 can optionally include the interconnection structure and the at least one stacked integrated circuit device being within a package module, wherein the package module comprises a support structure having a first surface and a second surface, wherein the interconnection structure is formed on the first surface of the support structure, wherein a plurality of module-to-device interconnects are formed on the second surface of the support structure and are electrically connected to the interconnection structure, and wherein the at least one stacked integrated circuit device is electrically attached to the interconnection structure.

In Example 4, the subject matter of Example 3 can optionally include a package mold material at least partially encasing the at least one stacked integrated circuit device.

In Example 5, the subject matter of any of Examples 1 to 4 can optionally include the electronic interposer comprising an upper section having between two and four layers, wherein each layer comprises an organic material layer and at least one conductive route comprising at least one conductive trace and at least one conductive via; a lower section having between two and four layers, wherein each layer comprises an organic material layer and at least one conductive route comprising at least one conductive trace and at least one conductive via; and a middle section between the upper section and the lower section, wherein the middle section comprises up to eight layers, wherein each layer comprises an organic material and at least one conductive route comprising at least one conductive trace and at least one conductive via, and wherein a thickness of each layer of the middle section is thinner than a thickness of any of the layers of the upper section and thinner than a thickness of any of the layers of the lower section; and a plurality of die side integrated circuit devices electrically attached to the upper section of the electronic interposer.

In Example 6, the subject matter of Example 5 can optionally include the thickness of each layer of the upper section being between about 13 and 40 microns, wherein the thickness of each layer of the upper section is between about 13 and 40 microns, and wherein the thickness of each layer of the middle section is between about 1.5 and 9 microns.

In Example 7, the subject matter of either Example 5 or 6 can optionally include the at least one conductive trace of the upper section comprises a plurality of conductive traces having a width of about 8 microns or greater, a spacing of about 8 microns or greater, and a thickness of between 8 and 15 microns; wherein the at least one conductive trace of the lower section comprises a plurality of conductive traces having a width of about 8 microns or greater, a spacing of about 8 microns or greater, and a thickness of between 8 and 15 microns; and wherein the at least one conductive trace of the middle section comprises a plurality of conductive traces having a width between about 0.75 microns and 3 microns, a spacing between about 0.75 microns and 3 microns, and a thickness of between 0.5 microns and 4 microns, and wherein the at least one conductive via has a thickness of between about 1 and 6 microns.

In Example 8, the subject matter of any of Examples 5 to 7 can optionally include at least one high-density device-to-device conductive route within the middle section.

In Example 9, the subject matter of any of Examples 5 to 8 can optionally include at least one conductive trace of the middle section having an enhanced thickness.

In Example 10, the subject matter of any of Examples 5 to 9 can optionally include at least one land side integrated circuit device electrically attached to the lower section of the electronic interposer.

In Example 11, the subject matter of Example 10 can optionally include the at least one land side integrated circuit device comprises a plurality of land side integrated circuit devices; and further comprising at least one high-density device-to-device conductive route within the middle section which electrically interconnects one land side integrated circuit device of the plurality of land side integrated circuit devices with another land side integrated circuit device of the plurality of land side integrated circuit devices.

In Example 12, the subject matter of Example 10 can optionally include at least one land side integrated circuit device embedded the lower section of the electronic interposer.

In Example 13, the subject matter of Example 12 can optionally include the at least one land side integrated circuit device comprises a plurality of land side integrated circuit devices; and further comprising at least one high-density device-to-device conductive route within the middle section which electrically interconnects one land side integrated circuit device of the plurality of land side integrated circuit devices with another land side integrated circuit device of the plurality of land side integrated circuit devices.

Example 14 is an electronic system, comprising a board and an integrated circuit package electrically attached to the board, wherein the integrated circuit package comprises an electronic interposer; at least one die side integrated circuit device having an active surface electrically attached to the electronic interposer, wherein the at least one die side integrated circuit device is at least partially encased in a mold material layer and wherein a back surface of the at least one die side integrated circuit device is in substantially the same plane as an outer surface of the mold material layer; and at least one stacked integrated circuit device electrically attached to the back surface of the at least one die side integrated circuit device through an interconnection structure formed between the at least one die side integrated circuit device and the at least one stacked integrated circuit device.

In Example 15, the subject matter of Example 14 can optionally include the interconnection structure abutting the back surface of the at least one die side integrated circuit device and abutting the outer surface of the mold material layer.

In Example 16, the subject matter of Example 14 can optionally include the interconnection structure and the at least one stacked integrated circuit device being within a package module, wherein the package module comprises a support structure having a first surface and a second surface, wherein the interconnection structure is formed on the first surface of the support structure, wherein a plurality of module-to-device interconnects are formed on the second surface of the support structure and are electrically connected to the interconnection structure, and wherein the at least one stacked integrated circuit device is electrically attached to the interconnection structure.

In Example 17, the subject matter of Example 16 can optionally include a package mold material at least partially encasing the at least one stacked integrated circuit device.

In Example 18, the subject matter of any of Examples 14 to 17 can optionally include the electronic interposer comprising an upper section having between two and four layers, wherein each layer comprises an organic material layer and at least one conductive route comprising at least one conductive trace and at least one conductive via; a lower section having between two and four layers, wherein each layer comprises an organic material layer and at least one conductive route comprising at least one conductive trace and at least one conductive via; and a middle section between the upper section and the lower section, wherein the middle section comprises up to eight layers, wherein each layer comprises an organic material and at least one conductive route comprising at least one conductive trace and at least one conductive via, and wherein a thickness of each layer of the middle section is thinner than a thickness of any of the layers of the upper section and thinner than a thickness of any of the layers of the lower section; and a plurality of die side integrated circuit devices electrically attached to the upper section of the electronic interposer.

In Example 19, the subject matter of Example 18 can optionally include the thickness of each layer of the upper section being between about 13 and 40 microns, wherein the thickness of each layer of the upper section is between about 13 and 40 microns, and wherein the thickness of each layer of the middle section is between about 1.5 and 9 microns.

In Example 20, the subject matter of either Example 18 or 19 can optionally include the at least one conductive trace of the upper section comprises a plurality of conductive traces having a width of about 8 microns or greater, a spacing of about 8 microns or greater, and a thickness of between 8 and 15 microns; wherein the at least one conductive trace of the lower section comprises a plurality of conductive traces having a width of about 8 microns or greater, a spacing of about 8 microns or greater, and a thickness of between 8 and 15 microns; and wherein the at least one conductive trace of the middle section comprises a plurality of conductive traces having a width between about 0.75 microns and 3 microns, a spacing between about 0.75 microns and 3 microns, and a thickness of between 0.5 microns and 4 microns, and wherein the at least one conductive via has a thickness of between about 1 and 6 microns.

In Example 21, the subject matter of any of Examples 18 to 20 can optionally include at least one high-density device-to-device conductive route within the middle section.

In Example 22, the subject matter of any of Examples 18 to 21 can optionally include at least one conductive trace of the middle section having an enhanced thickness.

In Example 23, the subject matter of any of Examples 18 to 22 can optionally include at least one land side integrated circuit device electrically attached to the lower section of the electronic interposer.

In Example 24, the subject matter of Example 23 can optionally include the at least one land side integrated circuit device comprises a plurality of land side integrated circuit devices; and further comprising at least one high-density device-to-device conductive route within the middle section which electrically interconnects one land side integrated circuit device of the plurality of land side integrated circuit devices with another land side integrated circuit device of the plurality of land side integrated circuit devices.

In Example 25, the subject matter of Example 23 can optionally include at least one land side integrated circuit device embedded the lower section of the electronic interposer.

In Example 26, the subject matter of Example 25 can optionally include the at least one land side integrated circuit device comprises a plurality of land side integrated circuit devices; and further comprising at least one high-density device-to-device conductive route within the middle section which electrically interconnects one land side integrated circuit device of the plurality of land side integrated circuit devices with another land side integrated circuit device of the plurality of land side integrated circuit devices.

Example 27 is a method of fabricating an integrated circuit package comprising forming an electronic interposer; forming at least one die side integrated circuit device; electrically attaching an active surface to the electronic interposer; at least partially encasing the at least one die side integrated circuit device is at least partially encased in a mold material layer, wherein a back surface of the at least one die side integrated circuit device is in substantially the same plane as an outer surface of the mold material layer; and electrically attaching at least one stacked integrated circuit device to the back surface of the at least one die side integrated circuit device through an interconnection structure formed between the at least one die side integrated circuit device and the at least one stacked integrated circuit device.

In Example 28, the subject matter of Example 27 can optionally include the interconnection structure abutting the back surface of the at least one die side integrated circuit device and abutting the outer surface of the mold material layer.

In Example 29, the subject matter of Example 27 can optionally include the interconnection structure and the at least one stacked integrated circuit device being within a package module, wherein the package module comprises a support structure having a first surface and a second surface, wherein the interconnection structure is formed on the first surface of the support structure, wherein a plurality of module-to-device interconnects are formed on the second surface of the support structure and are electrically connected to the interconnection structure, and wherein the at least one stacked integrated circuit device is electrically attached to the interconnection structure.

In Example 30, the subject matter of Example 29 can optionally include a package mold material at least partially encasing the at least one stacked integrated circuit device.

In Example 31, the subject matter of any of Examples 27 to 30 can optionally include the electronic interposer comprising an upper section having between two and four layers, wherein each layer comprises an organic material layer and at least one conductive route comprising at least one conductive trace and at least one conductive via; a lower section having between two and four layers, wherein each layer comprises an organic material layer and at least one conductive route comprising at least one conductive trace and at least one conductive via; and a middle section between the upper section and the lower section, wherein the middle section comprises up to eight layers, wherein each layer comprises an organic material and at least one conductive route comprising at least one conductive trace and at least one conductive via, and wherein a thickness of each layer of the middle section is thinner than a thickness of any of the layers of the upper section and thinner than a thickness of any of the layers of the lower section; and a plurality of die side integrated circuit devices electrically attached to the upper section of the electronic interposer.

In Example 32, the subject matter of Example 31 can optionally include the thickness of each layer of the upper section being between about 13 and 40 microns, wherein the thickness of each layer of the upper section is between about 13 and 40 microns, and wherein the thickness of each layer of the middle section is between about 1.5 and 9 microns.

In Example 33, the subject matter of either Example 31 or 32 can optionally include the at least one conductive trace of the upper section comprising a plurality of conductive traces having a width of about 8 microns or greater, a spacing of about 8 microns or greater, and a thickness of between 8 and 15 microns; wherein the at least one conductive trace of the lower section comprises a plurality of conductive traces having a width of about 8 microns or greater, a spacing of about 8 microns or greater, and a thickness of between 8 and 15 microns; and wherein the at least one conductive trace of the middle section comprises a plurality of conductive traces having a width between about 0.75 microns and 3 microns, a spacing between about 0.75 microns and 3 microns, and a thickness of between 0.5 microns and 4 microns, and wherein the at least one conductive via has a thickness of between about 1 and 6 microns.

In Example 34, the subject matter of any of Examples 31 to 33 can optionally include forming at least one high-density device-to-device conductive route within the middle section.

In Example 35, the subject matter of any of Examples 31 to 34 can optionally include forming at least one conductive trace of the middle section having an enhanced thickness.

In Example 36, the subject matter of any of Examples 31 to 35 can optionally include electrically attaching at least one land side integrated circuit device to the lower section of the electronic interposer.

In Example 37, the subject matter of Example 36 can optionally include the at least one land side integrated circuit device comprising a plurality of land side integrated circuit devices; and further comprising forming at least one high-density device-to-device conductive route within the middle section which electrically interconnects one land side integrated circuit device of the plurality of land side integrated circuit devices with another land side integrated circuit device of the plurality of land side integrated circuit devices.

In Example 38, the subject matter of Example 36 can optionally include embedding at least one land side integrated circuit device in the lower section of the electronic interposer.

In Example 39, the subject matter of Example 38 can optionally include the at least one land side integrated circuit device comprises a plurality of land side integrated circuit devices; and further comprising at least one high-density device-to-device conductive route within the middle section which electrically interconnects one land side integrated circuit device of the plurality of land side integrated circuit devices with another land side integrated circuit device of the plurality of land side integrated circuit devices.

Having thus described in detail embodiments of the present invention, it is understood that the invention defined by the appended claims is not to be limited by particular details set forth in the above description, as many apparent variations thereof are possible without departing from the spirit or scope thereof.

What is claimed is:

1. An integrated circuit package, comprising:
    an electronic interposer having a thickness between a first side of the interposer and a second, opposite, side of the interposer, wherein the electronic interposer consists of:
        an upper section of the interposer thickness having at least one upper section layer, wherein the at least one upper section layer comprises a dielectric material layer and at least one conductive route;
        a lower section of the interposer thickness having at least one lower section layer, wherein the at least one lower section layer comprises a dielectric material layer and at least one conductive route; and
        a middle section of the interposer thickness between the upper section and the lower section, wherein the middle section comprises at least one middle section layer, wherein the at least one middle section layer comprises a dielectric material layer and at least one conductive route, and wherein a thickness of the at least one middle section layer is thinner than a thickness of the at least one upper section layer and thinner than a thickness of the at least one lower section layer;
    at least one die side integrated circuit device having an active surface electrically attached to the first side of the electronic interposer through first solder interconnects, wherein the at least one die side integrated circuit device is at least partially encased in a mold material layer and wherein a back surface of the at least one die side integrated circuit device is in the same plane as an outer surface of the mold material layer; and
    at least one stacked integrated circuit device electrically attached to the back surface of the at least one die side integrated circuit device through an interconnection structure formed between the at least one die side integrated circuit device and the at least one stacked integrated circuit device.

2. The integrated circuit package of claim 1, wherein the interconnection structure abuts the back surface of the at least one die side integrated circuit device and abuts the outer surface of the mold material layer.

3. The integrated circuit package of claim 1, wherein the interconnection structure and the at least one stacked integrated circuit device are within a package module, wherein the package module comprises a support structure having a first surface and a second surface, wherein the interconnection structure is formed on the first surface of the support structure, wherein a plurality of module-to-device interconnects are formed on the second surface of the support structure and are electrically connected to the interconnection structure, and wherein the at least one stacked integrated circuit device is electrically attached to the interconnection structure.

4. The integrated circuit package of claim 3, further comprising a package mold material at least partially encasing the at least one stacked integrated circuit device.

5. The integrated circuit package of claim 1, further comprising at least one device-to-device conductive route within the middle section.

6. The integrated circuit package of claim 1, wherein the at least one conductive route of the middle section comprises a plurality of conductive traces, and wherein at least one conductive trace of the plurality of conductive traces of the middle section has a larger thickness in comparison with a thickness of another conductive trace of the plurality of conductive traces of the middle section.

7. The integrated circuit package of claim 1, wherein at least one dielectric material layer of at least one of the upper section, the lower section, and the middle section comprises an organic material.

8. An electronic system comprising:
    a board; and
    an integrated circuit package electrically attached to the board, wherein the integrated circuit package comprises:
        an electronic interposer having a thickness between a first side of the interposer and a second, opposite, side of the interposer, wherein the electronic interposer consists of:
            an upper section of the interposer thickness having at least one upper section layer, wherein the at least one upper section layer comprises a dielectric material layer and at least one conductive route;
            a lower section of the interposer thickness having at least one lower section layer, wherein the at least one lower section layer comprises a dielectric material layer and at least one conductive route; and
            a middle section of the interposer thickness between the upper section and the lower section, wherein the middle section comprises at least one middle section layer, wherein the at least one middle section layer comprises a dielectric material layer and at least one conductive route, and wherein a thickness of the at least one middle section layer is thinner than a thickness of the at least one upper section layer and thinner than a thickness of the at least one lower section layer;
        at least one die side integrated circuit device having an active surface electrically attached to the first side of the electronic interposer through first solder interconnects, wherein the at least one die side integrated circuit device is at least partially encased in a mold material layer and wherein a back surface of the at least one die side integrated circuit device is in the same plane as an outer surface of the mold material layer; and at least one stacked integrated circuit device electrically attached to the back surface of the at least one die side integrated circuit device through an interconnection structure formed between the at least one die side integrated circuit device and the at least one stacked integrated circuit device.

9. The electronic system of claim 8, wherein the interconnection structure abuts the back surface of the at least one die side integrated circuit device and abuts the outer surface of the mold material layer.

10. The electronic system of claim 8, wherein the interconnection structure and the at least one stacked integrated circuit device are within a package module, wherein the package module comprises a support structure having a first surface and a second surface, wherein the interconnection structure is formed on the first surface of the support structure, wherein a plurality of module-to-device interconnects are formed on the second surface of the support structure and are electrically connected to the interconnection structure, and wherein the at least one stacked integrated circuit device is electrically attached to the interconnection structure.

11. The electronic system of claim 10, further comprising a package mold material at least partially encasing the at least one stacked integrated circuit device.

12. The electronic system of claim 8, further comprising at least one device-to-device conductive route within the middle section.

13. The electronic system of claim 8, wherein the at least one conductive route of the middle section comprises a plurality of conductive traces, and wherein at least one conductive trace of the plurality of conductive traces of the middle section has a larger thickness in comparison with a thickness of another conductive trace of the plurality of conductive traces of the middle section.

14. The electronic system of claim 8, wherein at least one dielectric material layer of at least one of the upper section, the lower section, and the middle section comprises an organic material.

15. A method of fabricating an integrated circuit package, comprising:
  forming an electronic interposer having a thickness between a first side of the interposer and a second, opposite, side of the interposer, wherein forming the electronic interposer consists of:
    forming an upper section of the thickness having at least one upper section layer, wherein the at least one upper section layer comprises a dielectric material layer and at least one conductive route;
    forming a lower section of the thickness having at least one lower section layer, wherein the at least one lower section layer comprises a dielectric material layer and at least one conductive route; and
    forming a middle section of the thickness between the upper section and the lower section, wherein the middle section comprises at least one middle section layer, wherein the at least one middle section layer comprises a dielectric material layer and at least one conductive route, and wherein a thickness of the at least one middle section layer is thinner than a thickness of the at least one upper section layer and thinner than a thickness of the at least one lower section layer; and forming at least one die side integrated circuit device;

electrically attaching an active surface of the at least one die side integrated circuit device to the first side of the electronic interposer through first solder interconnects;

at least partially encasing the at least one die side integrated circuit device in a mold material layer, wherein a back surface of the at least one die side integrated circuit device is in the same plane as an outer surface of the mold material layer; and electrically attaching at least one stacked integrated circuit device to the back surface of the at least one die side integrated circuit device through an interconnection structure formed between the at least one die side integrated circuit device and the at least one stacked integrated circuit device.

16. The method of claim 15, wherein forming the interconnection structure comprises forming the interconnection structure to abut the back surface of the at least one die side integrated circuit device and to abut the outer surface of the mold material layer.

17. The method of claim 15, wherein the interconnection structure and the at least one stacked integrated circuit device are formed within a package module, wherein the package module comprises:
  forming a support structure having a first surface and a second surface;
  forming the interconnection structure on the first surface of the support structure;
  forming a plurality of module-to-device interconnects on the second surface of the support structure, wherein the plurality of module-to-device interconnects are electrically connected to the interconnection structure; and
  electrically attaching the at least one stacked integrated circuit device to the interconnection structure.

18. The method of claim 17, further comprising at least partially encasing the at least one stacked integrated circuit device in a package mold material.

19. The method of claim 15, further comprising electrically attaching the second side of the interposer to an external component through second solder features.

20. The method of claim 15, wherein the at least one conductive route of the middle section comprises a plurality of conductive traces, and wherein at least one conductive trace of the plurality of conductive traces of the middle section has a larger thickness in comparison with a thickness of another conductive trace of the plurality of conductive traces of the middle section.

* * * * *